US 012185543B2

(12) United States Patent
Chun et al.

(10) Patent No.: US 12,185,543 B2
(45) Date of Patent: Dec. 31, 2024

(54) SEMICONDUCTOR DEVICES COMPRISING CRACK PREVENTING LAYERS AND DATA STORAGE SYSTEMS INCLUDING THE SAME

(71) Applicant: SAMSUNG ELECTRONICS CO., LTD., Suwon-si (KR)

(72) Inventors: Sanghun Chun, Suwon-si (KR); Kwangyoung Jung, Hwaseong-si (KR); Youngji Noh, Suwon-si (KR); Junghwan Park, Seongnam-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 415 days.

(21) Appl. No.: 17/742,043

(22) Filed: May 11, 2022

(65) Prior Publication Data

US 2023/0005955 A1      Jan. 5, 2023

(30) Foreign Application Priority Data

Jul. 5, 2021      (KR) .................. 10-2021-0087985

(51) Int. Cl.
| | |
|---|---|
| *H10B 43/27* | (2023.01) |
| *H10B 41/10* | (2023.01) |
| *H10B 41/27* | (2023.01) |
| *H10B 41/35* | (2023.01) |

(Continued)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
None
See application file for complete search history.

(56) References Cited

U.S. PATENT DOCUMENTS

| | | |
|---|---|---|
| 9,524,981 B2 | 12/2016 | Pachamuthu et al. |
| 9,859,207 B2 | 1/2018 | Kim |
| 9,972,641 B1 | 5/2018 | Zhang et al. |
| (Continued) | | |

FOREIGN PATENT DOCUMENTS

| | | |
|---|---|---|
| KR | 10-2010-0091900 A | 8/2010 |
| KR | 10-2019-0012631 A | 2/2019 |
| KR | 10-2020-0046576 A | 5/2020 |

*Primary Examiner* — Nduka E Ojeh
(74) *Attorney, Agent, or Firm* — Muir Patent Law, PLLC

(57) ABSTRACT

A semiconductor device includes a substrate, gate electrodes stacked and spaced apart from each other in a first direction perpendicular to an upper surface of the substrate, channel structures penetrating the gate electrodes, extending in the first direction, and each including a channel layer, separation regions penetrating the gate electrodes, extending in the first direction and a second direction perpendicular to the first direction, and spaced apart from each other in a third direction perpendicular to the first direction and the second direction, and crack prevention layers disposed on at least a portion of the separation regions, wherein each of the separation regions includes a lower region and upper regions spaced apart from each other in the second direction on the lower region and protruding upwardly from the lower region, and wherein the crack prevention layers are in contact with upper surfaces of the upper regions.

20 Claims, 45 Drawing Sheets

(51) Int. Cl.
*H10B 43/10* (2023.01)
*H10B 43/35* (2023.01)

(56) References Cited

U.S. PATENT DOCUMENTS

| | | |
|---|---|---|
| 10,199,498 B2 | 2/2019 | Matsuura et al. |
| 2010/0202206 A1 | 8/2010 | Seol et al. |
| 2019/0035466 A1 | 1/2019 | Kim et al. |
| 2020/0135758 A1 | 4/2020 | Park et al. |
| 2021/0020657 A1 | 1/2021 | Song |
| 2021/0066343 A1 | 3/2021 | Choi et al. |
| 2022/0384363 A1* | 12/2022 | Furubayashi ......... H01L 23/562 |

* cited by examiner

SEMICONDUCTOR DEVICES COMPRISING CRACK PREVENTING LAYERS AND DATA STORAGE SYSTEMS INCLUDING THE SAME

CROSS TO REFERENCE TO RELATED APPLICATION

This application claims benefit of priority to Korean Patent Application No. 10-2021-0087985 filed on Jul. 5, 2021, in the Korean Intellectual Property Office, the disclosure of which is incorporated herein by reference in its entirety.

BACKGROUND

1. Field

Example embodiments relate to a semiconductor device and a data storage system including the same.

2. Description of the Related Art

There has been demand for a semiconductor device which may store high-capacity data in a data storage system requiring data storage. Accordingly, a measure for increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been suggested.

SUMMARY

According to an embodiment, a semiconductor device includes a substrate having a first region and a second region, gate electrodes stacked and spaced apart from each other in a first direction perpendicular to an upper surface of the substrate on the substrate and extending by different lengths in a second direction perpendicular to the first direction on the second region, channel structures penetrating the gate electrodes, extending in the first direction, and each including a channel layer, a horizontal conductive layer disposed below the gate electrodes on the substrate and in contact with the channel layer of each of the channel structures, separation regions penetrating the gate electrodes, extending in the first direction and the second direction, and spaced apart from each other in a third direction perpendicular to the first direction and the second direction, a cell region insulating layer covering the gate electrodes and the channel structures, an upper support layer disposed on the cell region insulating layer and having openings disposed to overlap the separation regions in the first direction, and crack prevention layers in contact with upper surfaces of the separation regions and having side surfaces, in the third direction, covered by the upper support layer, wherein each of the separation regions has a first width in the third direction, and each of the crack prevention layers has a second width greater than the first width in the third direction, and wherein lower surfaces of the crack prevention layers are disposed on a level higher than a level of upper surfaces of the channel structures.

According to an embodiment, a semiconductor device includes a substrate, gate electrodes stacked and spaced apart from each other in a first direction perpendicular to an upper surface of the substrate, channel structures penetrating the gate electrodes, extending in the first direction, and each including a channel layer, separation regions penetrating the gate electrodes, extending in the first direction and a second direction perpendicular to the first direction, and spaced apart from each other in a third direction perpendicular to the first direction and the second direction, and crack prevention layers disposed on at least a portion of the separation regions, wherein each of the separation regions includes a lower region and upper regions spaced apart from each other in the second direction on the lower region and protruding upwardly from the lower region, and wherein the crack prevention layers are in contact with upper surfaces of the upper regions.

According to an embodiment, a data storage system includes a semiconductor storage device including a substrate, circuit devices disposed on one side of the substrate, and input/output pads electrically connected to the circuit devices, and a controller electrically connected to the semiconductor storage device through the input/output pad and controlling the semiconductor storage device, wherein the semiconductor storage device includes gate electrodes stacked and spaced apart from each other in a first direction perpendicular to an upper surface of the substrate, channel structures penetrating the gate electrodes, extending in the first direction, and each including a channel layer, separation regions penetrating the gate electrodes, extending in the first direction and a second direction perpendicular to the first direction, and spaced apart from each other in a third direction perpendicular to the first direction and the second direction, and crack prevention layers disposed on at least a portion of the separation regions, wherein each of the separation regions includes a lower region and upper regions spaced apart from each other in the second direction on the lower region and protruding upwardly from the lower region, and wherein the crack prevention layers are in contact with upper surfaces of the upper regions.

BRIEF DESCRIPTION OF DRAWINGS

Features will become apparent to those of skill in the art by describing in detail example embodiments with reference to the attached drawings in which.

DETAILED DESCRIPTION

Figure 1A:
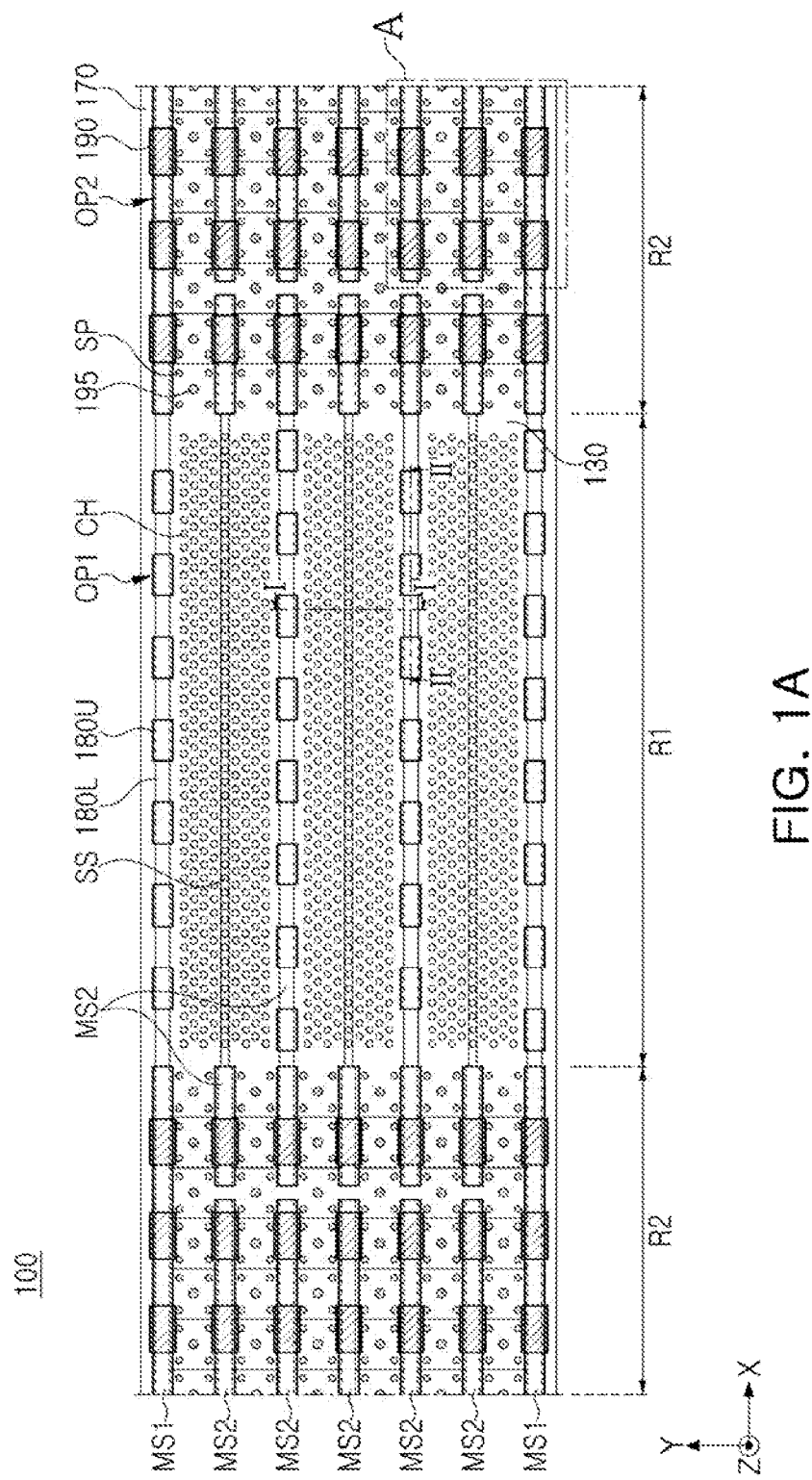
FIGS. 1A to 1C are views illustrating a semiconductor device according to an example embodiment.
Figure 1B:
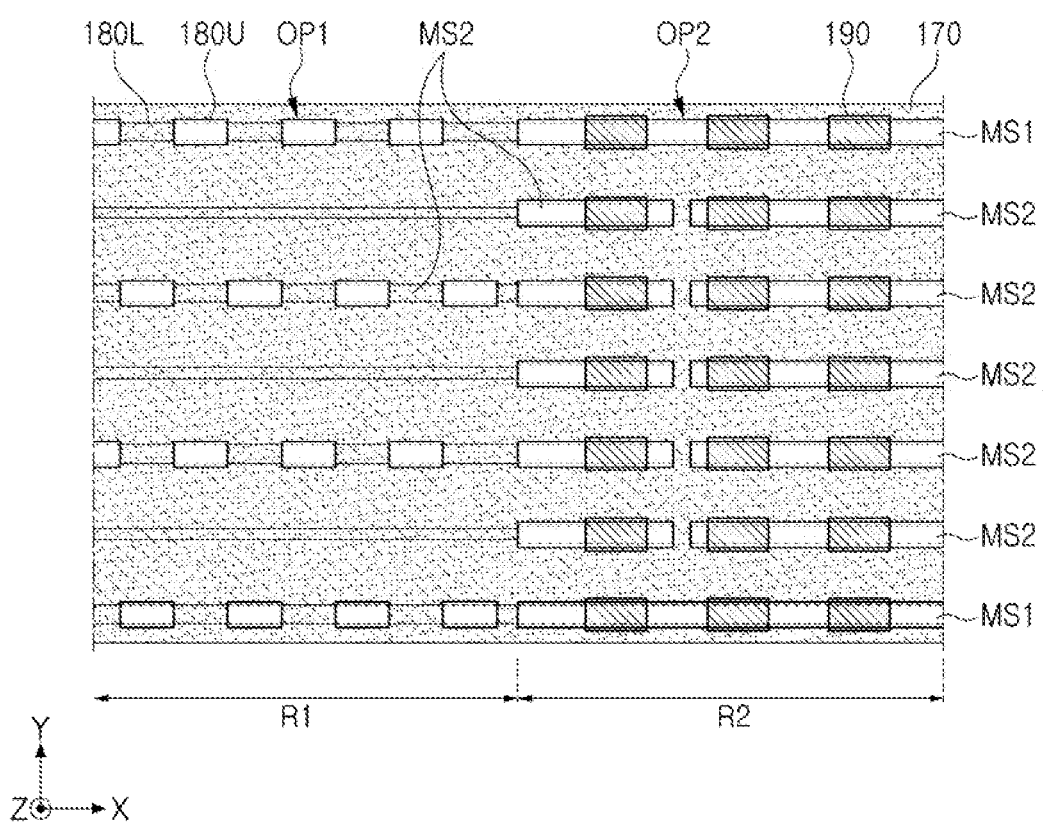
Figure 1C:
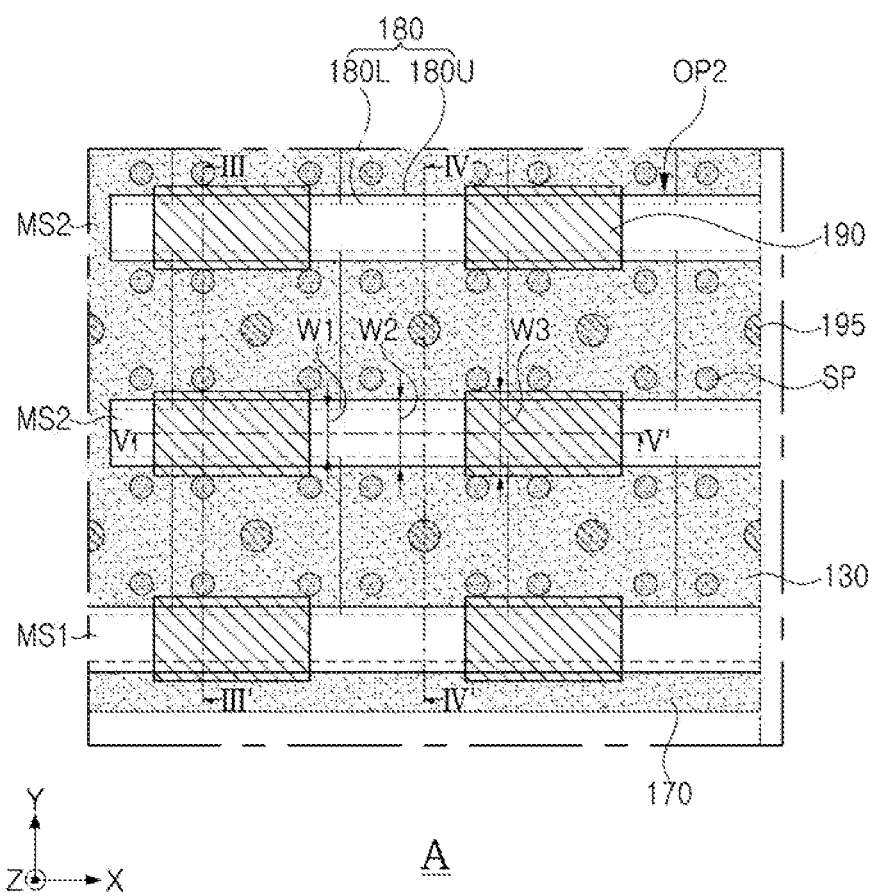

FIGS. 1A to 1C are views illustrating a semiconductor device according to an example embodiment. FIG. 1B is an enlarged view illustrating the right region in FIG. 1A, illustrating only a portion of the elements, such as an upper support layer 170, first and second separation regions MS1 and MS2, and a crack prevention layer 190. FIG. 1C is an enlarged view illustrating region "A" in FIG. 1A.

Figure 2A:
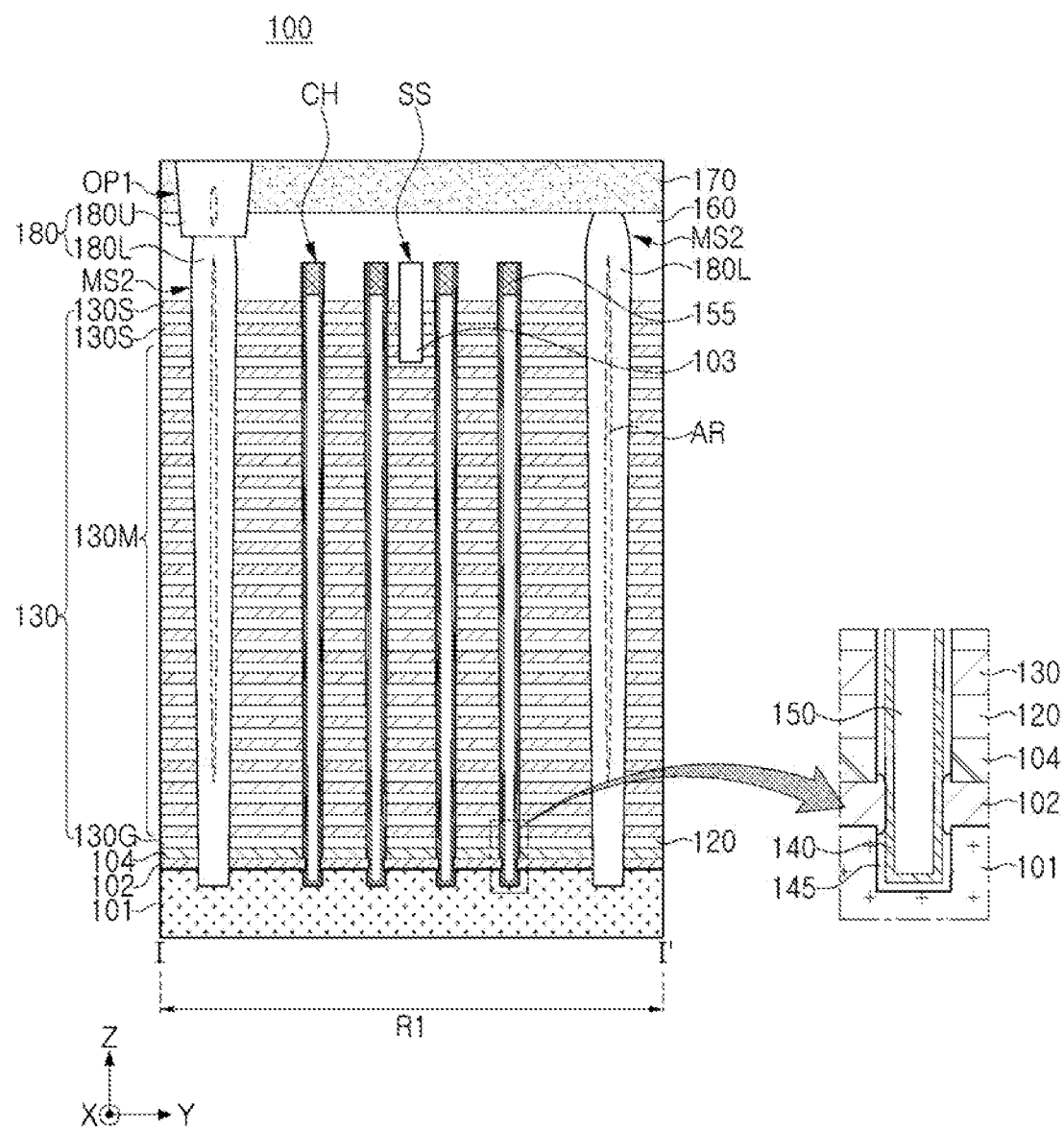
FIGS. 2A to 2E are cross-sectional views illustrating a semiconductor device according to an example embodiment.
Figure 2B:
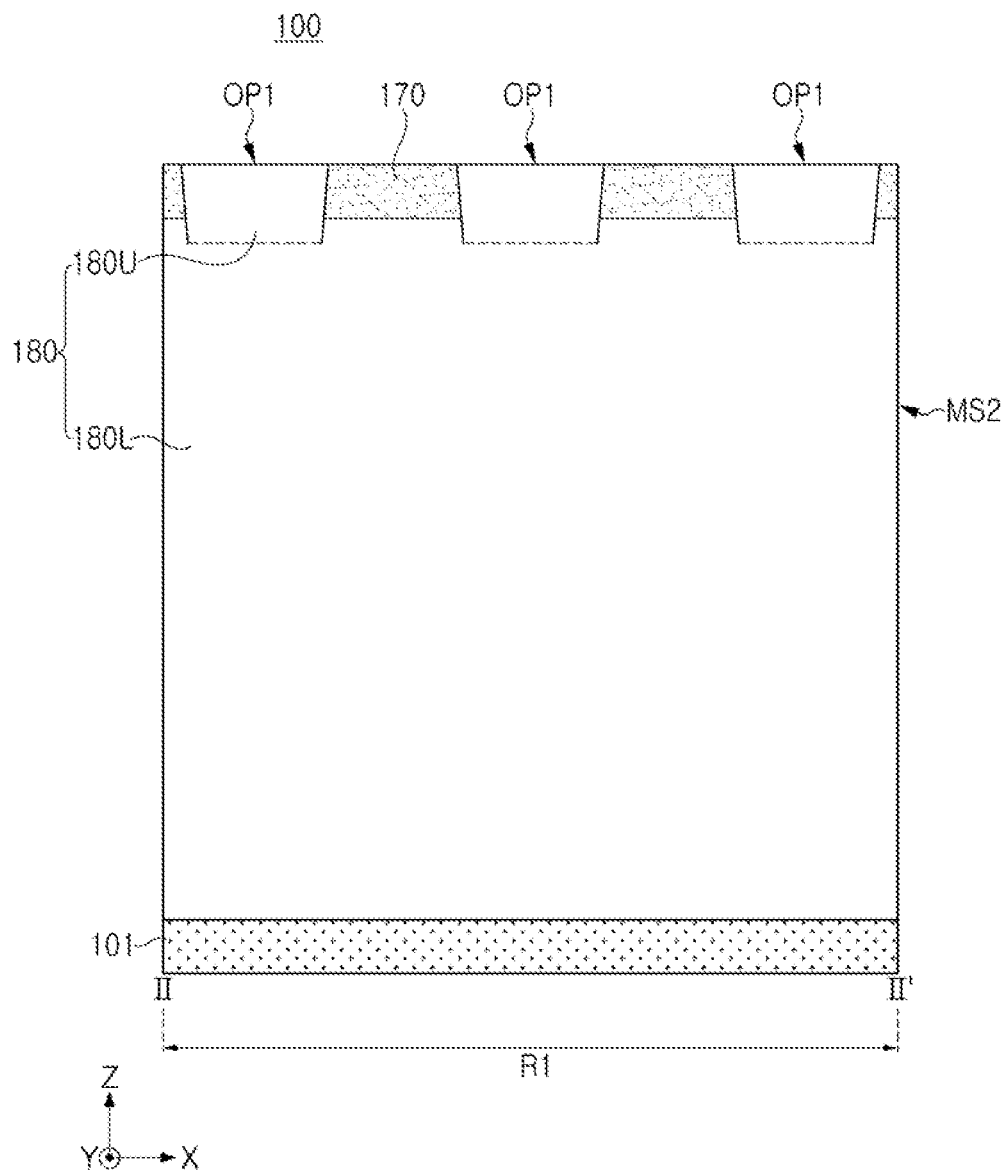
Figure 2C:
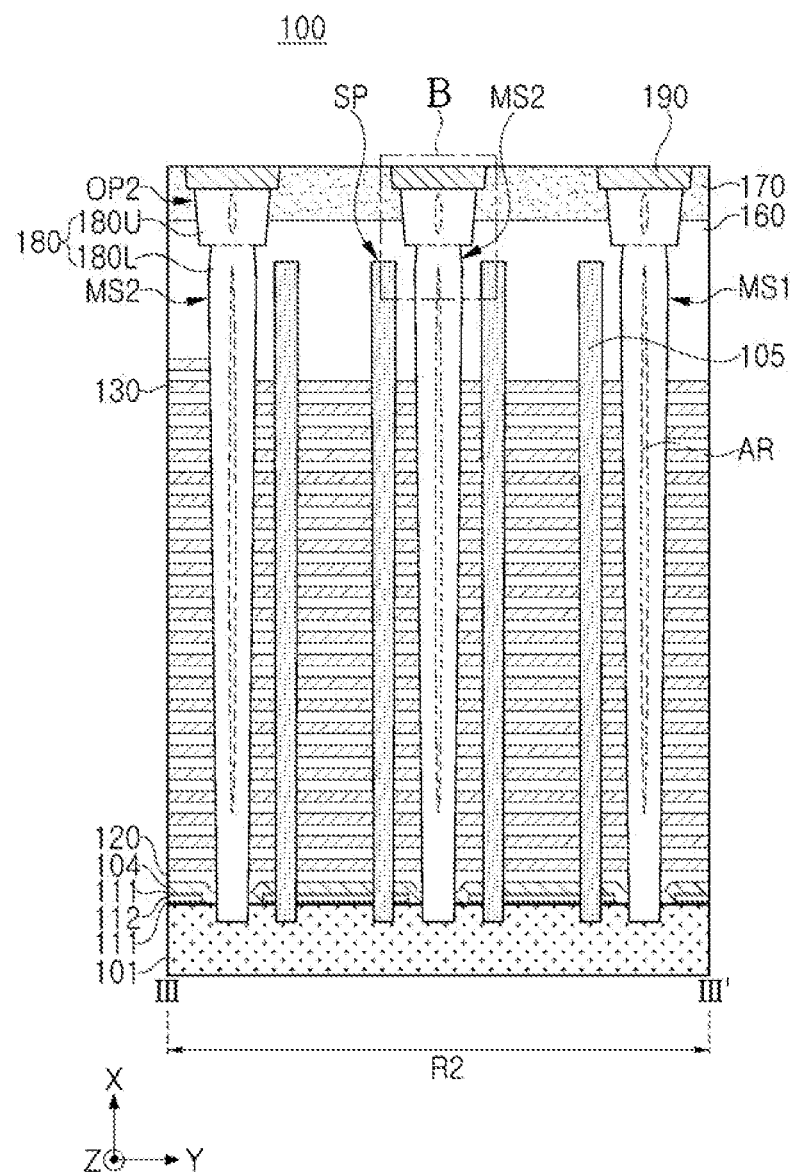
Figure 2D:
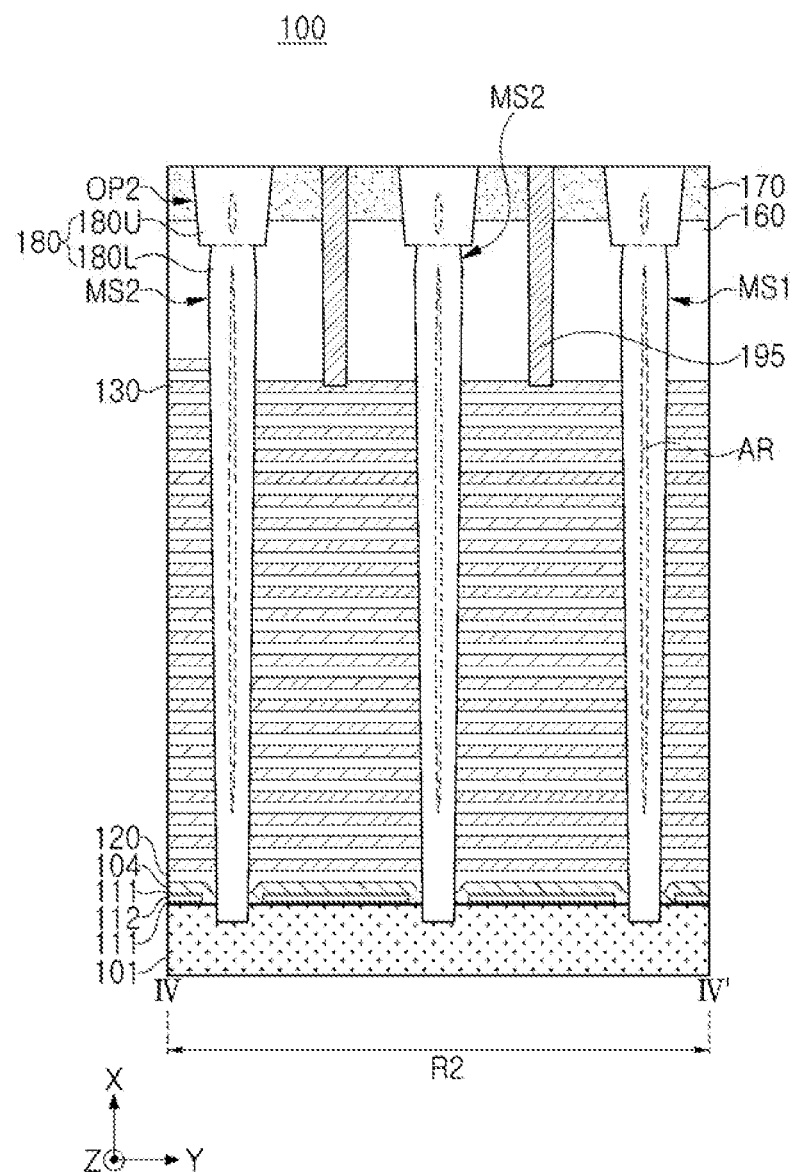
Figure 2E:
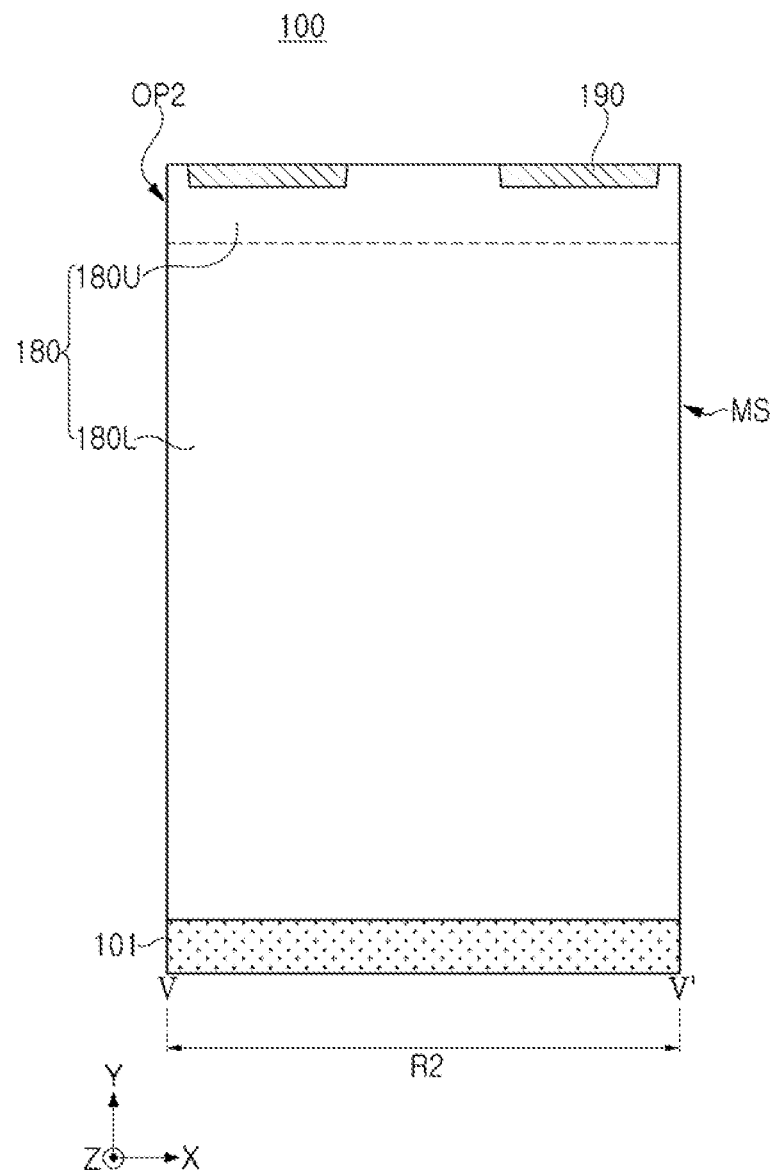

FIGS. 2A to 2E are cross-sectional views illustrating a semiconductor device according to an example embodiment. FIGS. 2A and 2B illustrate cross-sectional surfaces taken along lines I-I' and II-IF in FIG. 1A, respectively, and FIGS. 2C to 2E illustrate cross-sectional surfaces taken along lines IV-IV', and V-V in FIG. 1C.

Figure 3:
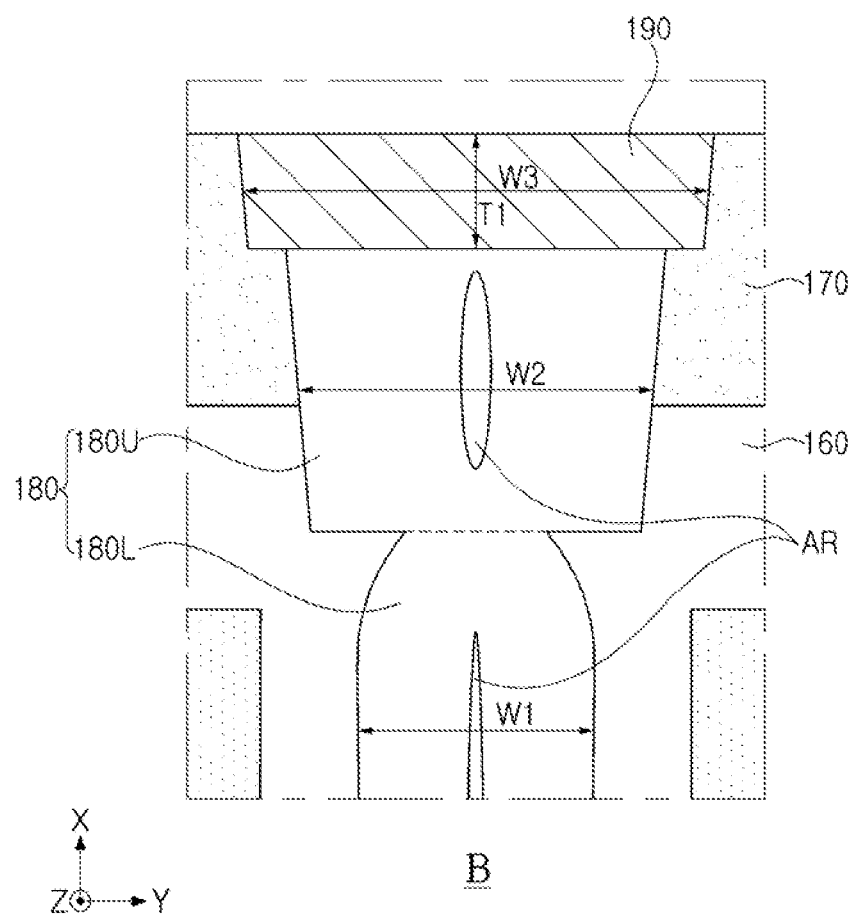
FIG. 3 is an enlarged view illustrating a portion of a semiconductor device according to an example embodiment.

FIG. 3 is an enlarged view illustrating a portion of a semiconductor device according to an example embodiment, illustrating region "B" in FIG. 2C.

Referring to FIGS. 1A to 3, a semiconductor device 100 may include a substrate 101 having a first region R1 and a second region R2, first and second horizontal conductive layers 102 and 104 on the substrate 101, gate electrodes 130 stacked on the substrate 101, interlayer insulating layers 120 alternately stacked with the gate electrodes 130 on the substrate 101, and channel structures CH disposed to penetrate the stack structure of the electrodes 130 and each including a channel layer 140, upper separation regions SS penetrating a portion of the stack structure, first and second separation regions MS1 and MS2 extending by penetrating the stack structure, a cell region insulating layer 160 covering the gate electrodes 130 and the channel structures CH, an upper support layer 170 disposed on the cell region insulating layer 160, and crack prevention layers 190 in contact with upper surfaces of the first and second separation regions MS1 and MS2. The semiconductor device 100 may further include support structures SP disposed to penetrate the stack structure of the gate electrodes 130 and gate contacts 195 connected to the gate electrodes 130.

In the semiconductor device 100, a single memory cell string may be configured around each channel structure CH, and a plurality of memory cell strings may be arranged in columns and rows in the X-direction and the Y-direction.

The substrate 101 may have an upper surface extending in the X-direction and the Y-direction. In the first region R1 of the substrate 101, the gate electrodes 130 may be vertically stacked and the channel structures CH may be disposed, and memory cells may be disposed in the first region R1.

In the second region R2 of the substrate 101, the gate electrodes 130 may extend by different lengths, and the second region R2 may be provided to electrically connect the memory cells to a peripheral circuit region. The second region R2 may be disposed on at least one end of the first region R1 in at least one direction, such as, for example, the X-direction.

The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The first and second horizontal conductive layers 102 and 104 may be stacked on the upper surface of the substrate 101. The first horizontal conductive layer 102 may function as at least a portion of a common source line of the semiconductor device 100, and for example, the first horizontal conductive layer 102 may function as a common source line together with the substrate 101. Referring to the enlarged view in FIG. 2A, the first horizontal conductive layer 102 may be directly connected to the channel layer 140 around the channel layer 140.

The first and second horizontal conductive layers 102 and 104 may include a semiconductor material, such as polycrystalline silicon. In this case, at least the first horizontal conductive layer 102 may be a layer doped with impurities of the same conductivity type as that of the substrate 101, and the second horizontal conductive layer 104 may be a doped layer or an intrinsic semiconductor layer, or may be a layer including impurities diffused from the first horizontal conductive layer 102. However, the material of the second horizontal conductive layer 104 is not limited to the semiconductor material, and may be replaced with an insulating layer in example embodiments. In example embodiments, a relatively thin insulating layer may be disposed on an upper surface and/or a lower surface of the first horizontal conductive layer 102. The insulating layer may be a first horizontal sacrificial layer 111 remaining during the process of manufacturing the semiconductor device 100 without being removed.

The gate electrodes 130 may be vertically stacked and spaced apart from each other on the substrate 101, and may form a stack structure. The gate electrodes 130 may include a lower gate electrode 130G forming a gate of a ground select transistor, memory gate electrodes 130M forming a plurality of memory cells, and upper gate electrodes 130S forming gates of the string select transistors.

The number of memory gate electrodes 130M forming the memory cells may be determined depending on capacity of the semiconductor device 100. According to an example embodiment, the number of each of the upper and lower gate electrodes 130S and 130G may be one or two or more, and may have a structure the same as or different from that of the memory gate electrodes 130M.

In example embodiments, the gate electrodes 130 may further include a gate electrode 130 disposed above the upper gate electrodes and/or below the lower gate electrodes and forming an erase transistor using an erase operation using a gate induced leakage current (GIDL) phenomenon. Also, a portion of the gate electrodes 130, the memory gate electrodes 130M adjacent to the upper or lower gate electrodes 130S and 130G, for example, may be dummy gate electrodes.

The gate electrodes 130 may be separated from each other in the Y-direction by the first separation regions MS1 continuously extending from the first region R1 and the second region R2. The gate electrodes 130 between the first separation regions MS1 may form a single memory block, but the example of the memory block is not limited thereto.

A portion of the gate electrodes 130, such as, for example, the memory gate electrodes 130M, may form a single layer in a single memory block.

The gate electrodes 130 may be vertically stacked and spaced apart from each other on the first region R1 and the second region R2, and may extend from the first region R1 to the second region R2 by different lengths, such that the gate electrodes 130 may form a stepped structure in the form of a staircase in a portion of the second region R2. The gate electrodes 130 may have a stepped structure by a predetermined unit in the Y-direction as well.

The gate electrodes 130 may be electrically connected to the gate contacts 195 through upper surfaces exposed from the upper gate electrodes 130 in the second region R2.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may spaced apart from each other in a direction perpendicular to the upper surface of the substrate 101.

The interlayer insulating layers 120 may include an insulating material such as silicon oxide or silicon nitride.

The channel structures CH may form each single memory cell string, and may be spaced apart from each other while forming rows and columns on the first region R1 of the substrate 101. The channel structures CH may form a grid pattern on the x-y plane or may be disposed in a zigzag pattern in one direction.

The channel structures CH may have a columnar shape, and may have an inclined side surface having a width decreasing toward the substrate 101 depending on an aspect ratio.

Among the channel structures CH, the channel structures CH penetrate the upper separation regions SS may be dummy channels which do not substantially form the memory cell string. Also, in example embodiments, the channel structures CH disposed adjacent to the second region R2 on the end of the first region R1 may also be dummy channels.

Referring to the enlarged view in FIG. 2A, each of the channel structures CH may further include a gate dielectric layer 145, a channel filling insulating layer 150 between the channel layers 140, and a channel pad 155 on an upper end, in addition to the channel layer 140.

The channel layer 140 may be formed in an annular shape surrounding the internal channel filling insulating layer 150. However, according to an example embodiment, the channel layer 140 may have a columnar shape such as a cylindrical shape or a prism shape without the channel filling insulating layer 150. The channel layer 140 may be connected to the first horizontal conductive layer 102 in a lower portion.

The channel layer 140 may include a semiconductor material such as polycrystalline silicon or single crystal silicon, and the semiconductor material may be an undoped material or a material including P-type or N-type impurities.

The gate dielectric layer 145 may be disposed between the gate electrodes 130 and the channel layer 140. In example embodiments, at least a portion of the gate dielectric layer 145 may extend in a horizontal direction along the gate electrodes 130.

Although not specifically illustrated, the gate dielectric layer 145 may include a tunneling layer, a charge storage layer, and a blocking layer sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof.

The channel pads 155 may be electrically connected to the channel layer 140 in the channel structures CH. The channel pads 155 may cover an upper surface of the channel filling insulating layer 150, and may be in contact with the channel layer 140 through side surfaces.

The channel pads 155 may include, for example, doped polycrystalline silicon.

The support structures SP may be spaced apart from each other while forming rows and columns on the second region R2 of the substrate 101. The support structures SP may work as supports during the process of manufacturing the semiconductor device 100.

The support structures SP may have a structure the same as or different from the channel structures CH. For example, the support structures SP may have an insulating pillar structure including the support insulating layer 105 as illustrated in FIG. 2C, or, in other example embodiments, the support structures SP may have the same structure as the channel structures CH. A height of the support structures SP may be similar to or higher than a height of the channel structures CH.

The support insulating layer 105 may include an insulating material, such as, for example, at least one of silicon oxide, silicon nitride, and silicon oxynitride.

The upper separation regions SS may be disposed on the first region R1 of the substrate 101, and may extend in the X-direction between the first and second separation regions MS1 and MS2 adjacent to each other in the Y-direction.

The upper separation regions SS may penetrate a portion of the gate electrodes 130 including uppermost upper gate electrodes 130S among the gate electrodes 130. Referring to FIG. 2A, the upper separation regions SS may separate three gate electrodes 130 from each other in the Y-direction, for example. However, the number of gate electrodes 130 separated by the upper separation regions SS may be varied in example embodiments.

The upper separation regions SS may include an upper separation insulating layer 103. The upper separation insulating layer 103 may include an insulating material, such as, for example, at least one of silicon oxide, silicon nitride, and silicon oxynitride.

In example embodiments, the upper separation regions SS may penetrate the dummy channel structures among the channel structures CH.

The cell region insulating layer 160 may cover the gate electrodes 130 and the channel structures CH. The cell region insulating layer 160 may include a plurality of insulating layers in example embodiments.

The cell region insulating layer 160 may be formed of an insulating material, and may include, for example, at least one of silicon oxide, silicon nitride, and silicon oxynitride.

The first and second separation regions MS1 and MS2 may penetrate the gate electrodes 130, the interlayer insulating layers 120, and the first and second horizontal conductive layers 102 and 104, may extend in the X-direction, and may be connected to the substrate 101. Referring to FIG.

1A, the first and second separation regions MS1 and MS2 may be disposed parallel to each other. The first separation regions MS1 may extend as an integrated region along the first region R1 and the second region R2, and the second separation regions MS2 may be disposed only in the second region R2, or may be intermittently disposed in the first region R1 and in the second region R2. The first separation regions MS1 may divide the gate electrodes 130 in the Y-direction. However, in example embodiments, the arrangement order of the first and second separation regions MS1 and MS2 and the spacing therebetween may be varied. The first and second separation regions MS1 and MS2 may have a shape of which a width may decrease toward the substrate 101 due to a high aspect ratio.

Referring to FIGS. 2A and 2C, the first and second separation regions MS1 and MS2 may include separation insulating layers 180 disposed in a trench.

The separation insulating layers 180 may include an insulating material, such as, for example, at least one of silicon oxide, silicon nitride, and silicon oxynitride. For example, the separation insulating layers 180 may include an aluminum oxide layer forming an external side surface and a silicon oxide layer disposed on an internal side.

The separation insulating layers 180 may include lower regions 180L and upper regions 180U. The lower region 180L and the upper region 180U may be referred to as a lower region and an upper region of the first and second separation regions MS1 and MS2, respectively. The upper regions 180U may protrude upwardly from the lower regions 180L in the Z-direction. The upper regions 180U may protrude as a width thereof in the Y-direction extends from the lower regions 180L. The upper regions 180U may extend from the lower regions 180L into the first and second openings OP1 and OP2 of the upper support layer 170 in the Z-direction.

The upper regions 180U may have different shapes in the first region R1 and the second region R2. Referring to FIG. 1B, in the first region R1, the upper regions 180U may be spaced apart from each other in the X-direction on each of the lower regions 180L. Referring to FIGS. 2A and 2B, in the first region R1, the upper regions 180U may extend into the first openings OP1 of the upper support layer 170. Referring to FIG. 1B, in the second region R2, the upper regions 180U may extend in the X-direction along each of the lower regions 180L. In the second region R2, the upper regions 180U may correspond to the lower regions 180L, respectively. Referring to FIGS. 2C to 2E, in the second region R2, the upper regions 180U may extend into the second openings OP2 of the upper support layer 170.

Referring to FIGS. 1C and 3, the lower region 180L may have a first width W1 in the Y-direction, and the upper region 180U may have a second width W2 greater than the first width W1 in the Y-direction. A bent portion may be formed as the width changes steeply between the lower region 180L and the upper region 180U, and the side surfaces of the lower region 180L and the side surfaces of the upper region 180U may be shifted relative to each other in the Y-direction.

As described further below, the first width W1 and the second width W2 may each be smaller than a third width W3 of the crack prevention layer 190 thereon.

Each of the lower regions 180L and the upper regions 180U may have a seam AR disposed in a center along the Y-direction. However, in example embodiments, the seam AR may be disposed only in the lower regions 180L or may not be present.

The upper support layer 170 may be disposed on the first and second separation regions MS1 and MS2 and the cell region insulating layer 160, and may have first and second openings OP1 and OP2.

Referring to FIGS. 1A to 1C, the first and second openings OP1 and OP2 of the upper support layer 170 may overlap the first and second separation regions MS1 and MS2 on the first and second separation regions MS1 and MS2. The first and second openings OP1 and OP2 may have a rectangular shape on the plan view, but an example embodiment thereof is not limited thereto. The first and second openings OP1 and OP2 may have rounded corners depending on process conditions. In the first region R1, the first openings OP1 may be spaced apart from each other with a constant spacing in the X-direction, the extension direction of the first and second separation regions MS1 and MS2. In the second region R2, the second openings OP2 may extend in the X-direction along the first and second separation regions MS1 and MS2. The upper region 180U may extend from the first and second separation regions MS1 and MS2 in the first and second openings OP1 and OP2.

The upper support layer 170 may be formed of an insulating material, and may include, for example, at least one of silicon oxide, silicon nitride, and silicon oxynitride. The upper support layer 170 may be formed of a material the same as or different from the cell region insulating layer 160.

The crack prevention layers 190 may be disposed on a portion of the first and second separation regions MS1 and MS2, and may be connected to and in contact with upper surfaces of the first and second separation regions MS1 and MS2.

In an example embodiment, the crack prevention layers 190 may be disposed only in the second region R2. In the second region R2, the crack prevention layers 190 may overlap the first and second separation regions MS1 and MS2 in the extending direction of the first and second separation regions MS1 and MS2, and may be arranged with a constant spacing in the X-direction.

The crack prevention layers 190 may form columns and rows in the X-direction and the Y-direction. In example embodiments, the crack prevention layers 190 may be disposed in a zigzag pattern or in a checkerboard shape.

In FIGS. 1A to 1C, the crack prevention layers 190 may have a rectangular shape, but an example embodiment thereof is not limited thereto, and the crack prevention layers 190 may have various shapes such as a circular shape or an oval shape in the plan view.

The crack prevention layers 190 may be recessed into the upper support layer 170 and the upper regions 180U of the separation insulating layers 180. Lower surfaces of the crack prevention layers 190 may be disposed on a level higher than a level of upper surfaces of the channel structures CH and the support structures SP. In an example embodiment, lower surfaces of the crack prevention layers 190 may be disposed on a level higher than a level of the lower surfaces of the upper support layer 170. Lower surfaces of the crack prevention layers 190 may be disposed on a level higher than a level of the seam AR of the separation insulating layers 180. The upper surface of the crack prevention layers 190 may be coplanar with the upper surface of the upper support layer 170.

A capping insulating layer may be further disposed on the upper surface of the crack prevention layers 190 and the upper surface of the upper support layer 170.

The crack prevention layers 190 may be in contact with upper surfaces of the upper regions 180U of the separation insulating layers 180 through a lower surface thereof. Side surfaces of the crack prevention layers 190 in the Y-direction may be entirely covered by the upper support layer 170, and the side surfaces in the X-direction may be partially covered by the upper region 180U, and a portion including both ends may be covered by the upper support layer 170.

The crack prevention layers 190 may have a greater width than that of the first and second separation regions MS1 and MS2 in the Y-direction, and accordingly, the crack prevention layers 190 may have a width greater than that of the separation insulating layers 180 included in the first and second separation regions MS1 and MS2. The crack prevention layers 190 may have the third width W3 greater than the second width W2 of the upper regions 180U in the Y-direction. The width of the crack prevention layers 190 may be discontinuously increased from the width of the upper regions 180U from an interfacial surface with the upper regions 180U. Accordingly, the side surfaces of the crack prevention layer 190 and the side surface of the upper region 180U may not be coplanar with each other in the Y-direction, and may be spaced apart from each other, shifted, or offset in the Y-direction. A bent portion may be formed between the side surfaces of the crack prevention layer 190 and the side surfaces of the upper region 180U by the changes in width.

The crack prevention layers 190 may prevent cracks from being created upwardly from an upper end of the seam AR in the first and second separation regions MS1 and MS2.

The crack prevention layers 190 may include a material having a Young's modulus greater than that of the first and second separation regions MS1 and MS2. The crack prevention layers 190 may include a material having a Young's modulus greater than that of the cell region insulating layer 160 and/or the upper support layer 170.

The crack prevention layers 190 may include a material having a smaller difference in coefficients of thermal expansion with the substrate 101 than the upper support layer 170 includes. For example, a difference in coefficients of thermal expansion between the crack prevention layers 190 and the substrate 101 may be smaller than a difference in coefficients of thermal expansion between the upper support layer 170 and the substrate 101.

The crack prevention layers 190 may include, for example, at least one of silicon (Si), silicon nitride (SiN), and tungsten (W).

As described above, the crack prevention layers 190 may include a material having a relatively large Young's modulus, and may be disposed with a relatively greater width to replace a portion of the upper support layer 170 between the first and second separation regions MS1 and MS2. Thus, stress applied to the first and second separation regions MS1 and MS2 from left and right sides of the first and second separation regions MS1 and MS2 in the Y-direction may be reduced.

The stress may be caused by, for example, a difference in coefficients of thermal expansion between the substrate 101 and the cell region insulating layer 160 and the upper support layer 170, and may be applied in an external side direction of the first and second separation regions MS1 and MS2. Since the stress may cause cracks, cracks may be prevented by reducing the stress. Also, by disposing the crack prevention layer 190 having a relatively large Young's modulus on the first and second separation regions MS1 and MS2, rigidity of the entire structure including the first and second separation regions MS1 and MS2 and the crack prevention layer 190 may increase, thereby reducing cracks. Also, even if cracks are formed in the first and second separation regions MS1 and MS2, propagation of the cracks may be limited or prevented by the crack prevention layer 190 thereon.

A thickness T1 of the crack prevention layer 190 in the Z-direction may be determined in consideration of the reduction in crack creation as described above. For example, the thickness T1 of the crack prevention layer 190 may be in a range of about 1500 Å to about 5000 Å, or in a range of 1800 Å to about 2500 Å, for example. According to simulation results, when the thickness T1 of the crack prevention layer 190 is smaller than the above range, the effect of reducing the crack inducing force was small. Also, an upper limit of the thickness T1 of the crack prevention layer 190 may be determined in consideration of a level of an upper end of the upper support layer 170.

The width of the crack prevention layer 190 in the X-direction may be varied in example embodiments. The width of the crack prevention layer 190 in the Y-direction may be determined in a range in which a spacing with the gate contacts 195 is secured in consideration of the arrangement of the gate contacts 195.

Figure 4A:
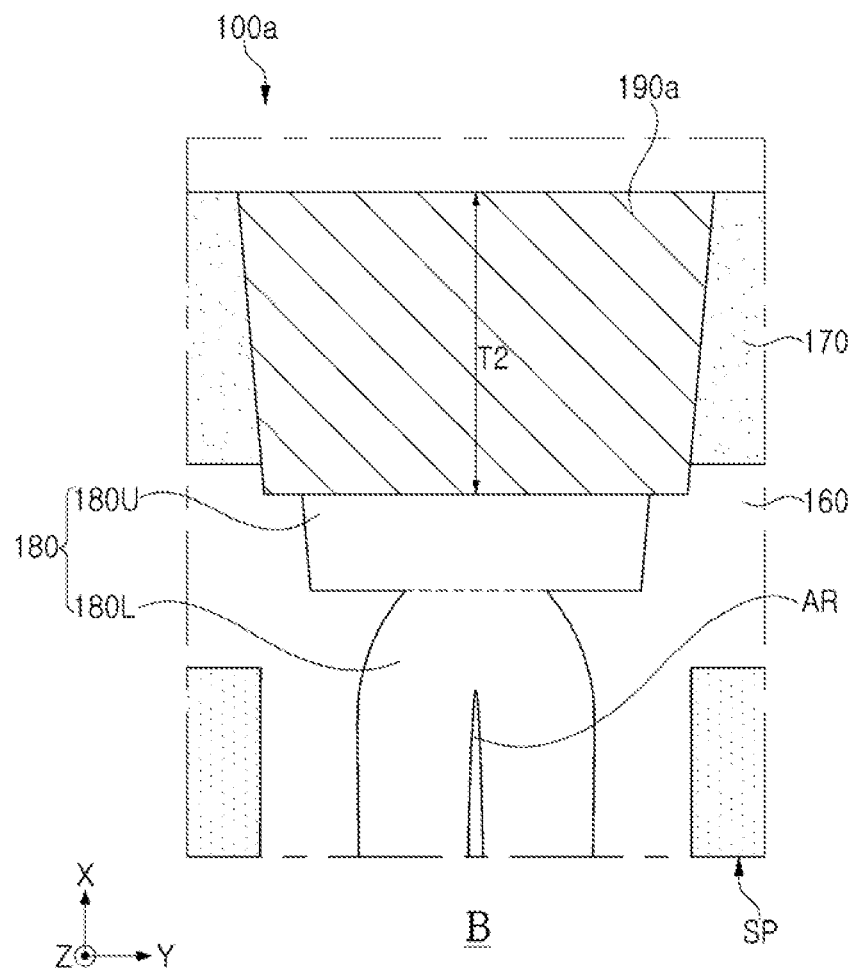
FIGS. 4A and 4B are enlarged views illustrating a portion of a semiconductor device according to an example embodiment.
Figure 4B:
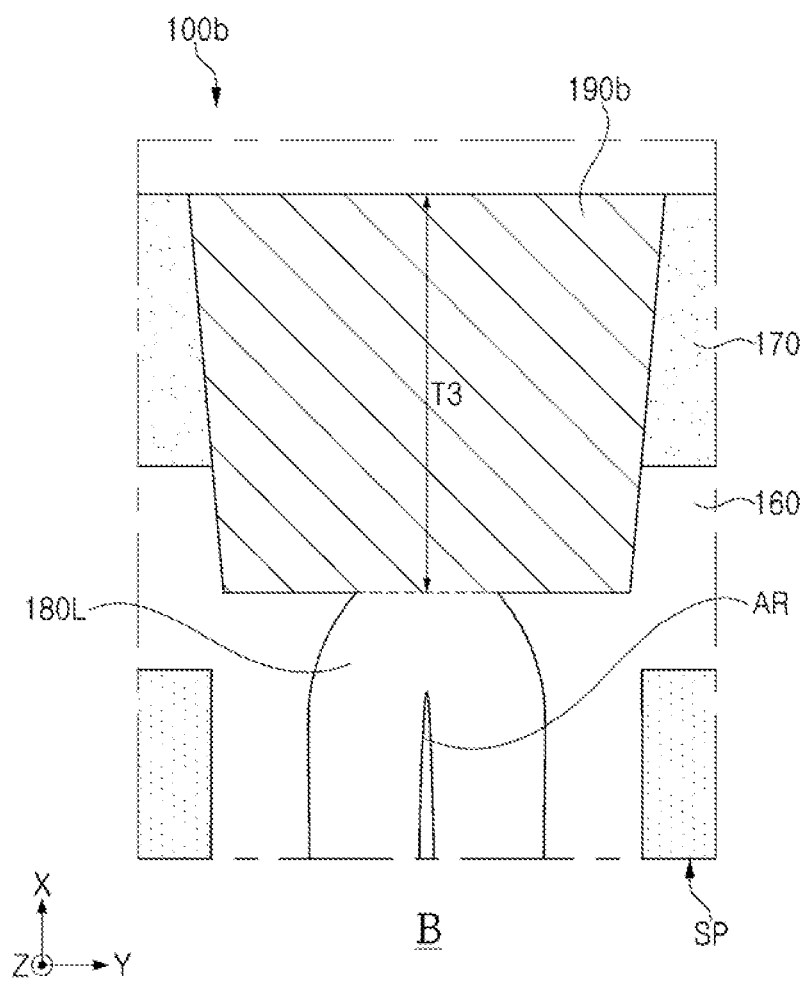

FIGS. 4A and 4B are enlarged views illustrating a portion of a semiconductor device according to an example embodiment, illustrating regions corresponding to FIG. 3.

Referring to FIG. 4A, in a semiconductor device 100a, a lower surface of the crack prevention layer 190a may lower than a lower surface of the upper support layer 170. The lower surface of the crack prevention layer 190a may be disposed in the cell region insulating layer 160. In an example embodiment, the crack prevention layer 190a may have a shape in which the crack prevention layer 190a is further recessed into the upper region 180U, and may have a thickness T2 greater than the thickness T1 in the example in FIG. 3.

The lower surface of the crack prevention layer 190a may be disposed on a level higher than a level of the upper surface of the support structures SP, but an example embodiment thereof is not limited thereto.

The lower surface of the crack prevention layer 190a may be disposed on a level higher than a level of the seam AR in the lower region 180L. Also, when the seam AR is included in the upper region 180U, the lower surface of the crack prevention layer 190a may be disposed on a level higher than a level of the seam AR in the upper region 180U.

Referring to FIG. 4B, in the semiconductor device 100b, the crack prevention layer 190b may be in contact with the lower region 180L. The lower surface of the crack prevention layer 190b may be disposed in the cell region insulating layer 160. In an example embodiment, the crack prevention layer 190b may have a shape in which the crack prevention layer 190b is recessed into the entire upper region 180U (compare to FIG. 3), and may have a thickness T3 that is greater than the thicknesses T1, T2 of the examples in FIGS. 3 and 4A.

The lower surface of the crack prevention layer 190b may be disposed on a level higher than a level of the seam AR in the lower region 180L.

The lower surface of the crack prevention layer 190b may be disposed on a level higher than the upper surface of the support structures SP, but an example embodiment thereof is not limited thereto. In example embodiments, for example, the crack prevention layer 190b may be recessed into the support structures SP and may extend downwardly.

As described above, in example embodiments, the depth or the thickness of the crack prevention layer 190b may be varied.

FIGS. 5A to 5D are plan views illustrating a semiconductor device according to an example embodiment, illustrating regions corresponding to FIG. 1B.

Figure 5A:
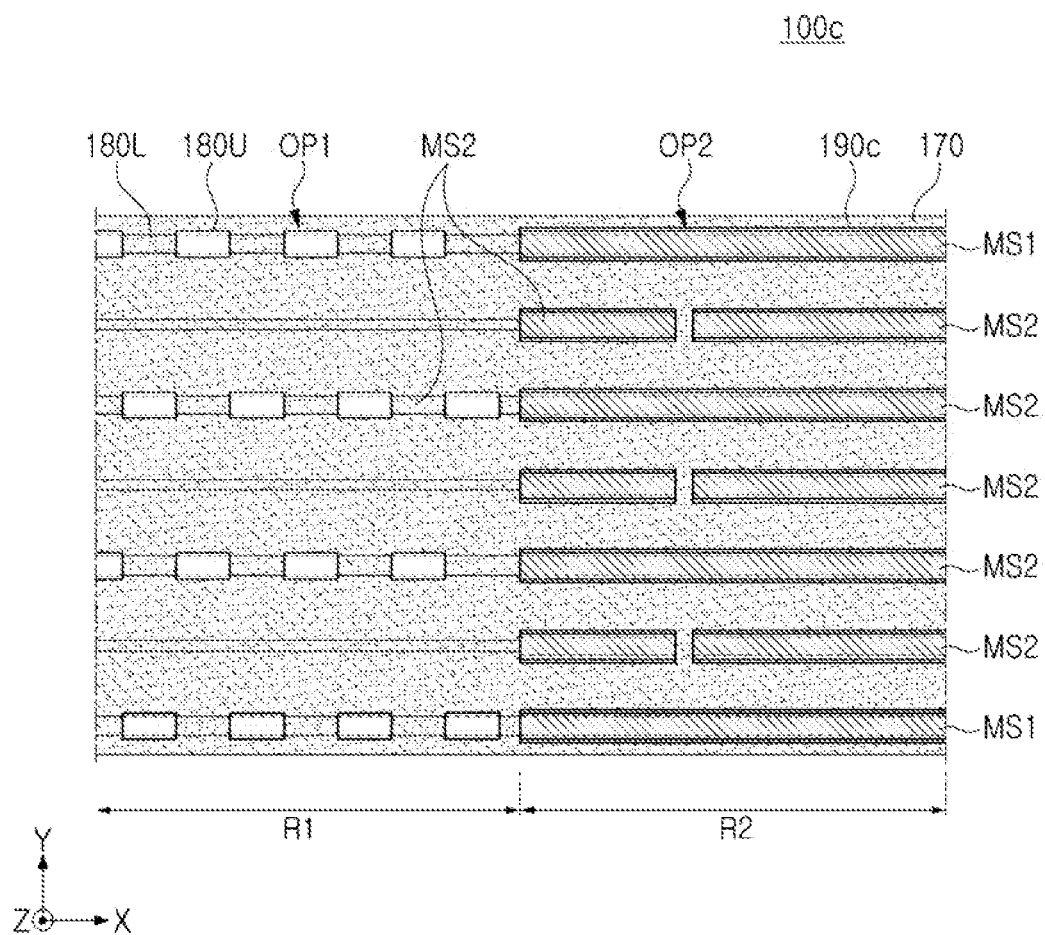
FIGS. 5A to 5D are plan views illustrating a semiconductor device according to an example embodiment.

Referring to FIG. 5A, in a semiconductor device 100c, crack prevention layers 190c may overlap the first and second separation regions MS1 and MS2 in the second region R2, and may extend in the X-direction along the first and second separation regions MS1 and MS2. For example, the crack prevention layers 190c may overlap the entire first and second separation regions MS1 and MS2 in the second region R2. In an example embodiment, entire side surfaces of the crack prevention layers 190c may be covered by the upper support layer 170.

In some example embodiments, the crack prevention layers 190c may extend in the X-direction along the first and second separation regions MS1 and MS2 even in the first region R1.

Figure 5B:
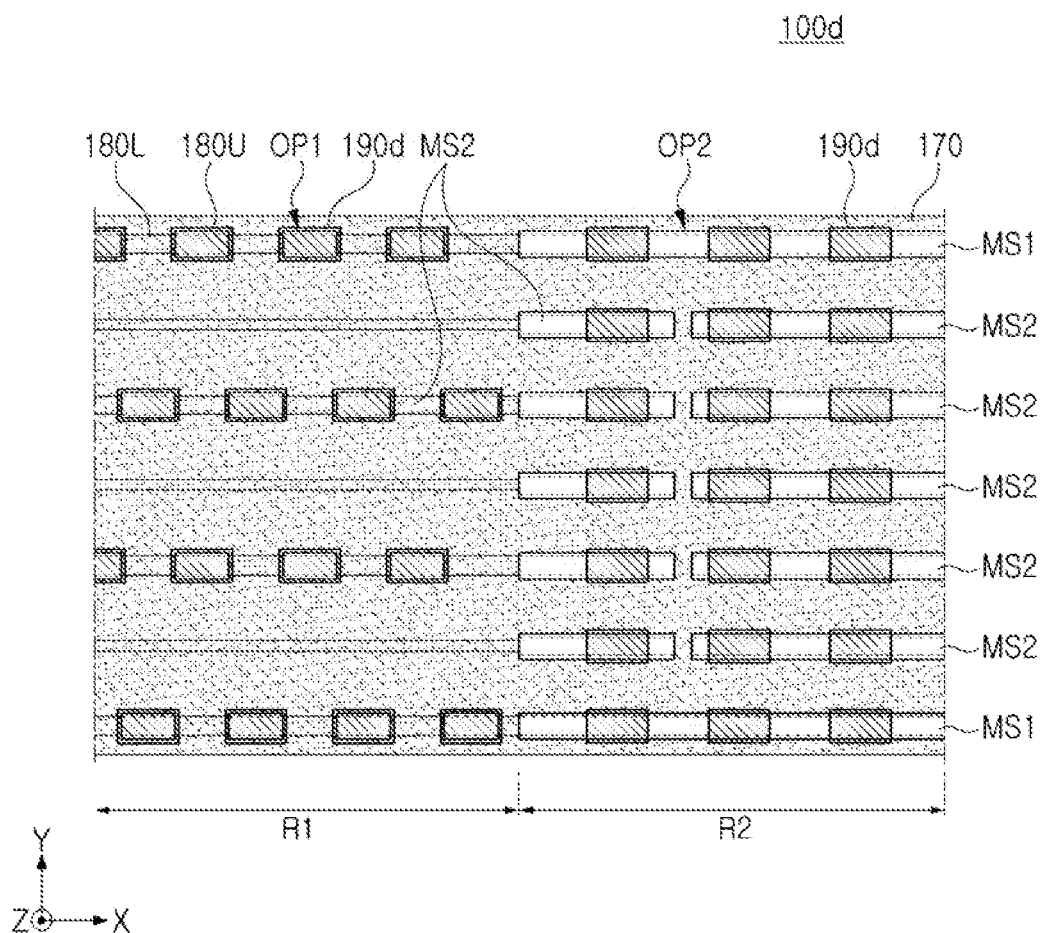

Referring to FIG. 5B, in a semiconductor device 100d, the crack prevention layers 190d may be further disposed in the first region R1. In the first region R1, the crack prevention layers 190d may overlap a portion of the first and second separation regions MS1 and MS2, and may be spaced apart from each other in the X-direction. For example, the crack prevention layers 190d may overlap the first openings OP1 of the upper support layer 170 in the first region R1, and may have a size larger than those of the first openings OP1 in a plan view. However, in example embodiments, the relative sizes of the first openings OP1 and the crack prevention layers 190d may be varied.

Figure 5C:
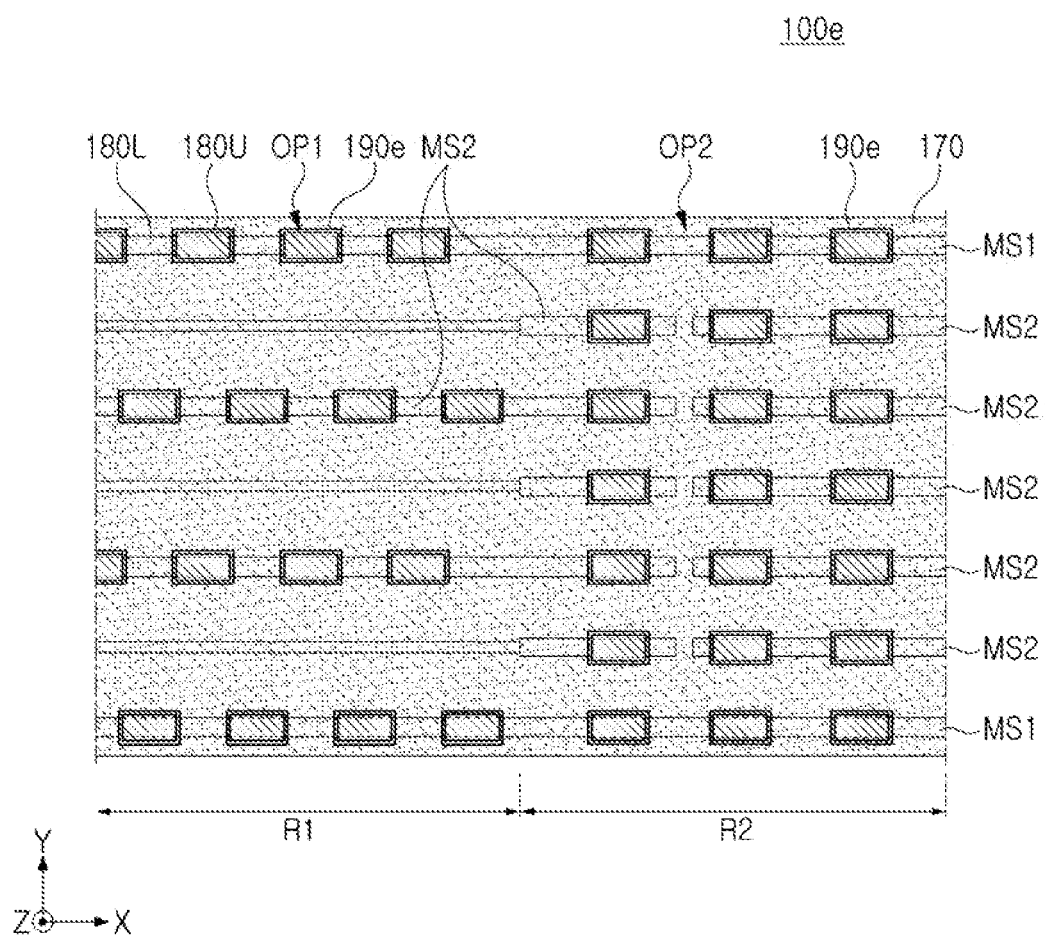

Referring to FIG. 5C, in a semiconductor device 100e, the first and second openings OP1 and OP2 of the upper support layer 170 and the crack prevention layers 190e may be disposed in the same or similar form in the first region R1 and the second region R2.

In the first region R1, the crack prevention layers 190e may be disposed in the same form as in the example embodiment in FIG. 5B.

In the second region R2, the second openings OP2 of the upper support layer 170 may be spaced apart from each other in the X-direction on the first and second separation regions MS1 and MS2, differently from the example embodiment in FIG. 1B. In the second region R2, the crack prevention layers 190e may overlap the second openings OP2 of the upper support layer 170, as in the first region R1. Accordingly, the crack prevention layers 190e may be spaced apart from each other in the X-direction. For example, the crack prevention layers 190e may have a size larger than those of the second openings OP2 of the upper support layer 170 in the second region R2 in a plan view. In example embodiments, the second openings OP2 and the crack prevention layers 190e overlapping the second openings OP2 may be disposed in a zigzag pattern as in the first region R1. In an example embodiment, entire side surfaces of the crack prevention layers 190e may be covered by the upper support layer 170.

In the first region R1 and the second region R2, the relative sizes of the first openings OP1 and the second openings OP2 may be varied. Accordingly, the sizes of the crack prevention layers 190e may be the same or different from each other in the first region R1 and the second region R2. Alternatively, in the first region R1 and the second region R2, even when the sizes of the first openings OP1 and the second openings OP2 are different from each other, the sizes of the crack prevention layers 190e may be constant.

Figure 5D:
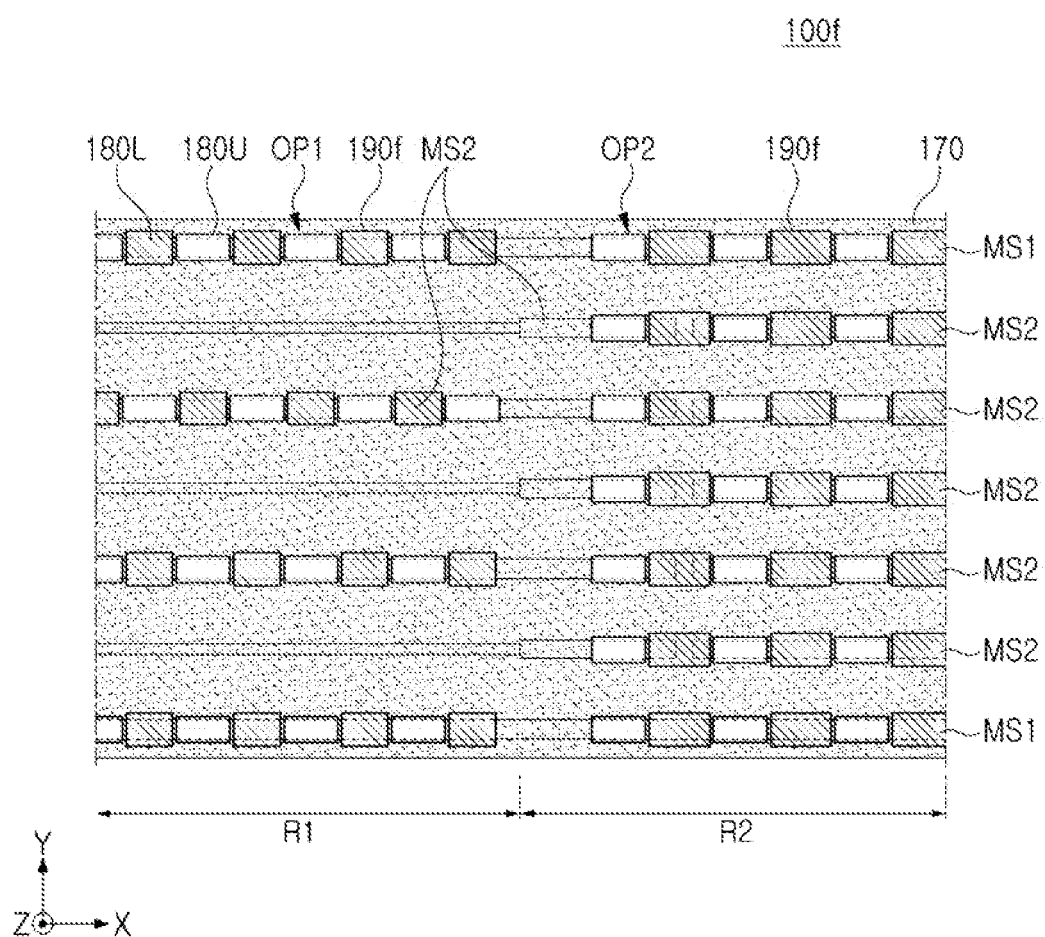

Referring to FIG. 5D, in a semiconductor device 100f, crack prevention layers 190f may not overlap the first and second openings OP1 and OP2 of the upper support layer 170.

The crack prevention layers 190f may not be necessarily overlap the first and second openings OP1 and OP2 of the upper support layer 170, and thus, the crack prevention layers 190f may be spaced apart from or be in contact with the first and second openings OP1 and OP2. In this case, in the cross-sectional views corresponding to FIGS. 2A and 2C, the crack prevention layers 190f may be in contact with upper surfaces of the lower regions 180L, rather than the upper regions 180U of the separation insulating layer 180. In an example embodiment, entire side surfaces of the crack prevention layers 190f may be covered by the upper support layer 170.

In example embodiments, side surfaces of the first and second openings OP1 and OP2 and side surfaces of the crack prevention layers 190f may be in contact with each other in the X-direction. In this case, a portion of the side surfaces of the crack prevention layers 190f in the X-direction may be covered by the upper regions 180U. Also, in example embodiments, a portion of the crack prevention layers 190f may overlap the first and second openings OP1 and OP2 of the upper support layer 170, and the other portion may not overlap the first and second openings OP1 and OP2.

Figure 6A:
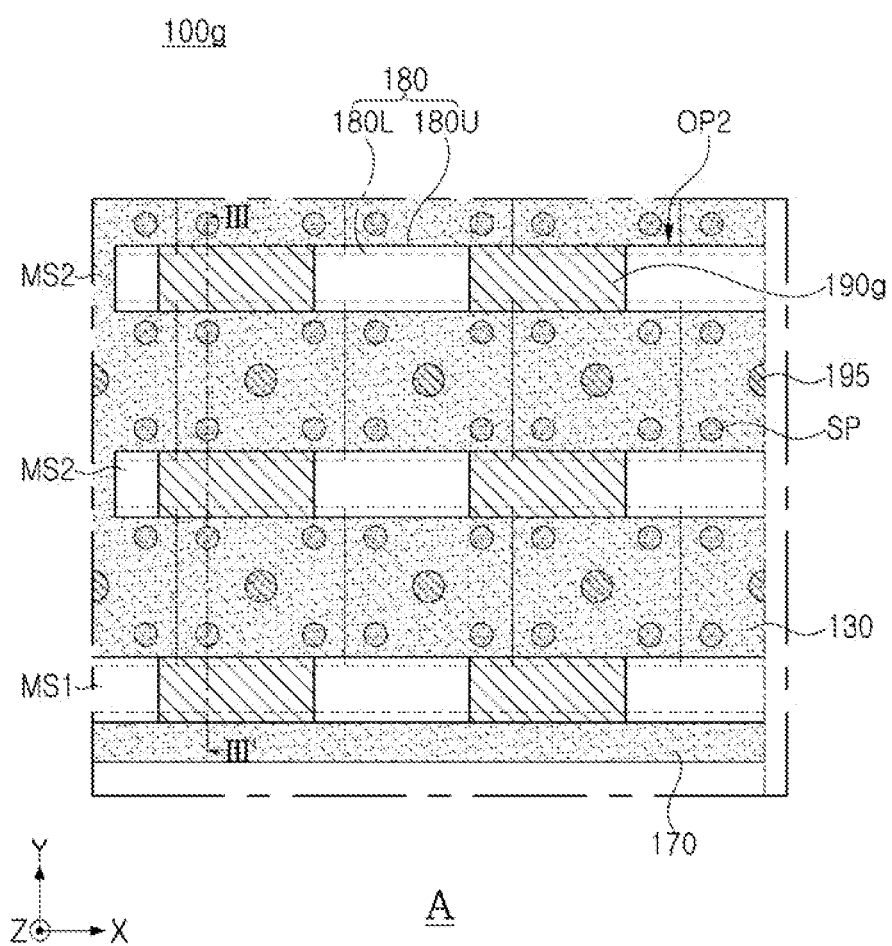
FIGS. 6A and 6B are a plan view and a cross-sectional view illustrating a semiconductor device according to an example embodiment.
Figure 6B:
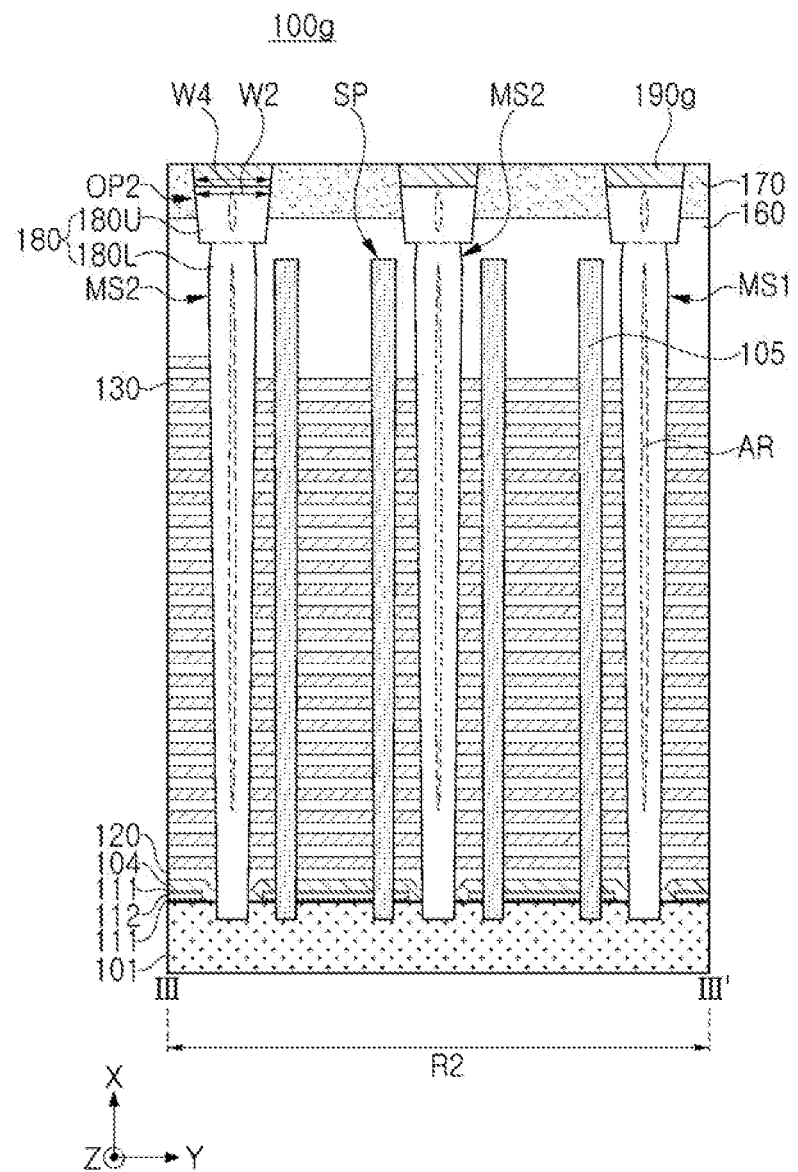

FIGS. 6A and 6B are a plan view and a cross-sectional view illustrating a semiconductor device according to an example embodiment. FIG. 6A illustrates a region corresponding to FIG. 1C. FIG. 6B illustrates a region corresponding to FIG. 2C.

Referring to FIGS. 6A and 6B, in a semiconductor device 100g, all of crack prevention layers 190g may overlap the first and second separation regions MS1 and MS2 in a plan view. Accordingly, the crack prevention layers 190g may have a shape in which the crack prevention layers 190g is recessed into the upper regions 180U of the separation insulating layers 180.

Referring to FIG. 6B, side surfaces of the crack prevention layer 190g may be coplanar with side surfaces of the upper region 180U. The side surfaces of the crack prevention layer 190g may have a slope that is the same as that of the side surfaces of the upper region 180U, and they may be connected to each other.

The crack prevention layer 190g may have a fourth width W4 in the Y-direction in a region adjacent to the interfacial surface with the upper region 180U, and the fourth width W4 may be substantially the same as the second width W2 of the upper region 180U, or may only have a difference formed by the inclination of the side surface.

Figure 7A:
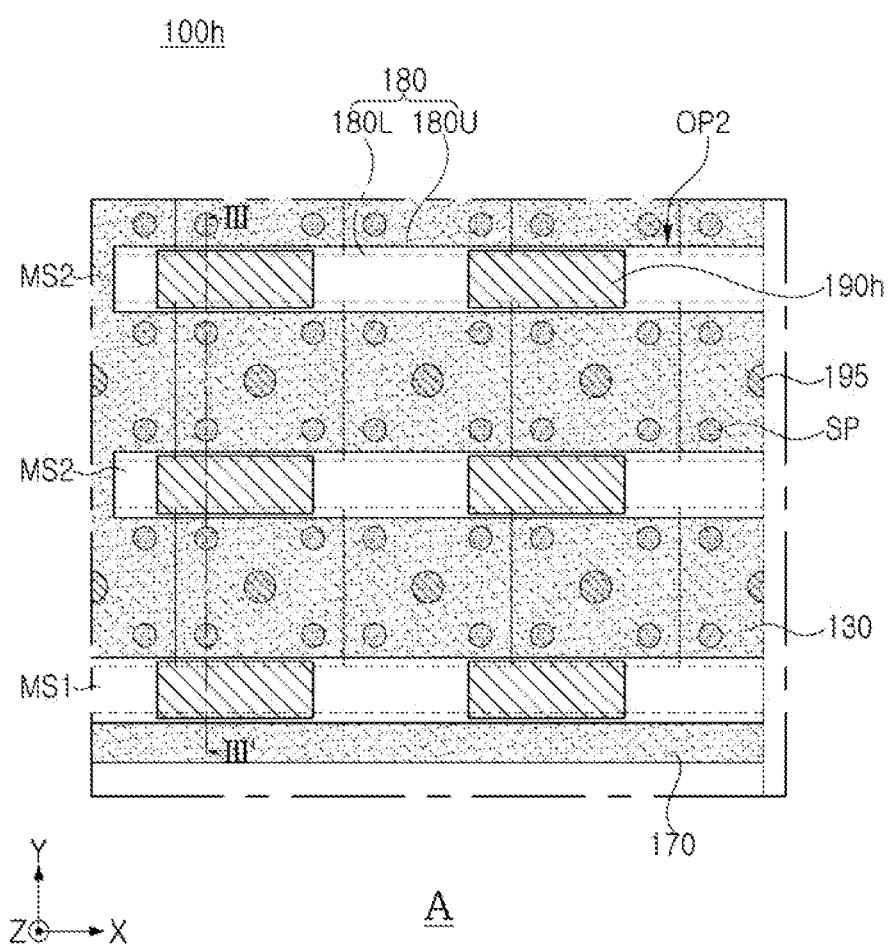
FIGS. 7A and 7B are a plan view and a cross-sectional view illustrating a semiconductor device according to an example embodiment.
Figure 7B:
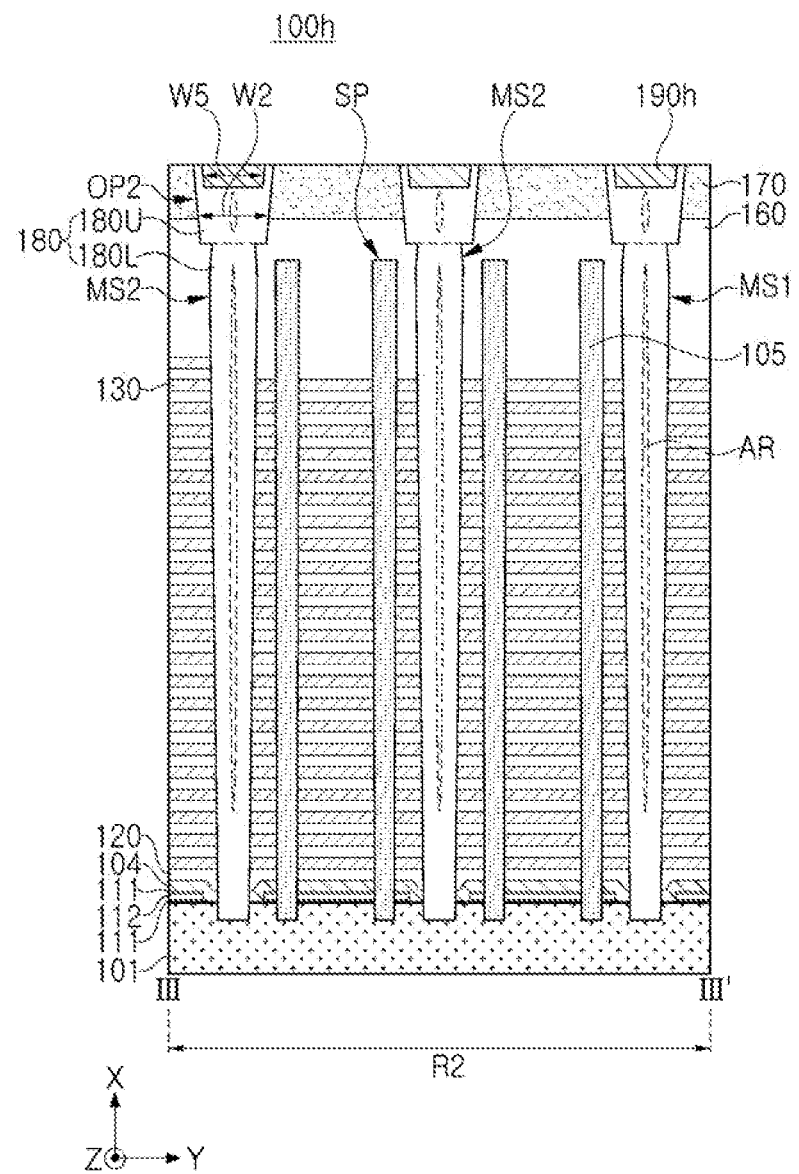

FIGS. 7A and 7B are a plan view and a cross-sectional view illustrating a semiconductor device according to an example embodiment. FIG. 7A illustrates a region corresponding to FIG. 1C. FIG. 7B illustrates a region corresponding to FIG. 2C.

Referring to FIGS. 7A and 7B, in a semiconductor device 100h, crack prevention layers 190h may be disposed such that side surfaces and lower surfaces thereof may be surrounded by the first and second separation regions MS1 and MS2. Accordingly, the crack prevention layers 190h may have a shape in which the crack prevention layers 190h is recessed into the upper regions 180U of the separation insulating layers 180.

Referring to FIG. 7B, the side surfaces of the crack prevention layer 190h may be covered by the upper region 180U.

The crack prevention layer 190h may have a fifth width W5 in the Y-direction, and the fifth width W5 may be smaller than the second width W2 of the upper region 180U.

As described above, the relative widths of the crack prevention layers 190h and the upper regions 180U may be varied in example embodiments.

Figure 8:
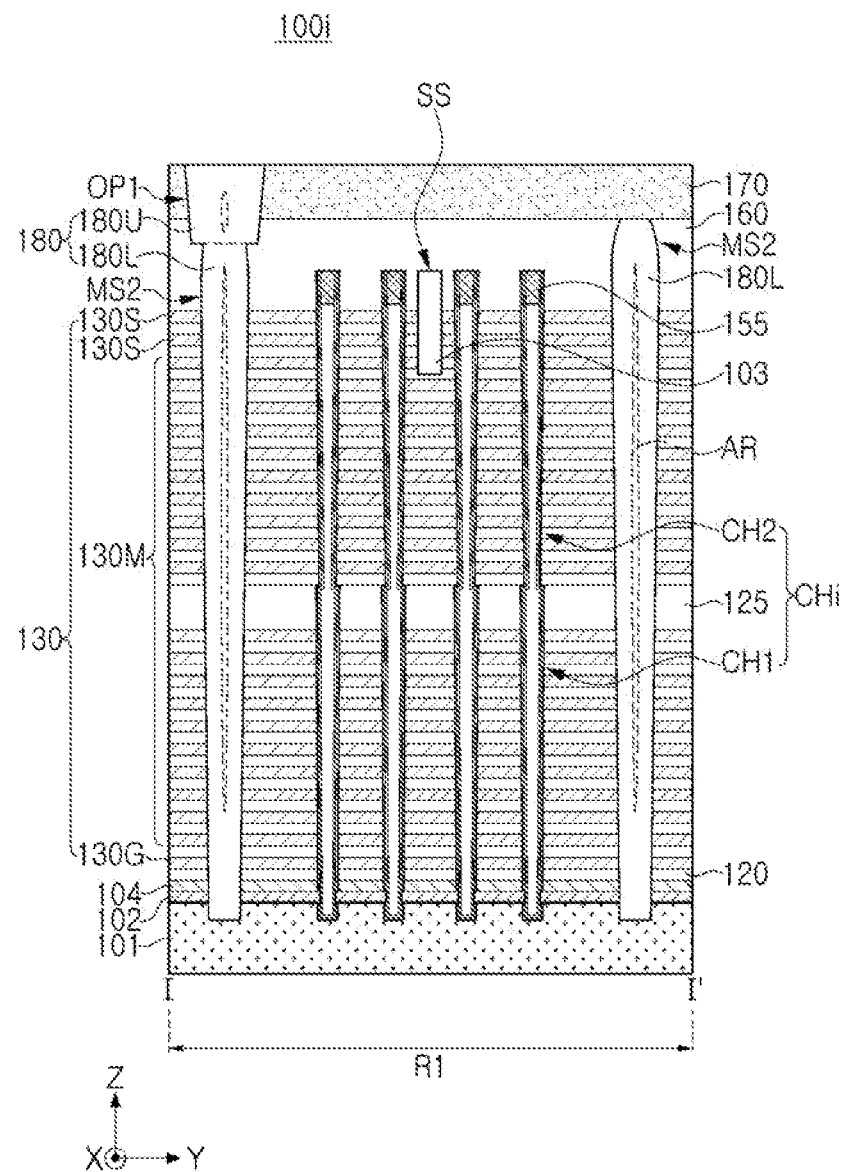
FIG. 8 is a cross-sectional view illustrating a semiconductor device according to an example embodiment.

FIG. 8 is a cross-sectional view illustrating a semiconductor device according to an example embodiment, illustrating a region corresponding to FIG. 2A.

Referring to FIG. 8, in a semiconductor device 100i, the stack structure of the gate electrodes 130 may be formed by lower and upper stack structures vertically stacked, and channel structures CHi may include first and second channel structures CH1 and CH2 vertically stacked.

The structure of the channel structures CHi may be introduced to stably form the channel structures CHi when the number of the stacked gate electrodes 130 is relatively large.

In example embodiments, the number of stacked channel structures may be varied.

The channel structures CHi may have a shape in which the lower first channel structures CH1 and the upper second channel structures CH2 are connected to each other, and may have a bent portion formed by a difference in width in the connection region.

The channel layer 140, the gate dielectric layer 145, and the channel filling insulating layer 150 may be connected to each other between the first channel structure CH1 and the second channel structure CH2.

The channel pad 155 may be disposed only on an upper end of the upper second channel structure CH2. However, in example embodiments, each of the first channel structure CH1 and the second channel structure CH2 may include a channel pad 155, and in this case, the channel pad of the first channel structure CH1 may be connected to the channel layer 140 of the second channel structure CH2.

An upper interlayer insulating layer 125 having a relatively great thickness may be disposed on an uppermost portion of the lower stack structure. However, the shapes of the interlayer insulating layers 120 and the upper interlayer insulating layer 125 may be varied in the example embodiments.

The shape of the channel structures CHi including the plurality of structures may be applied to the other example embodiments.

Figure 9:
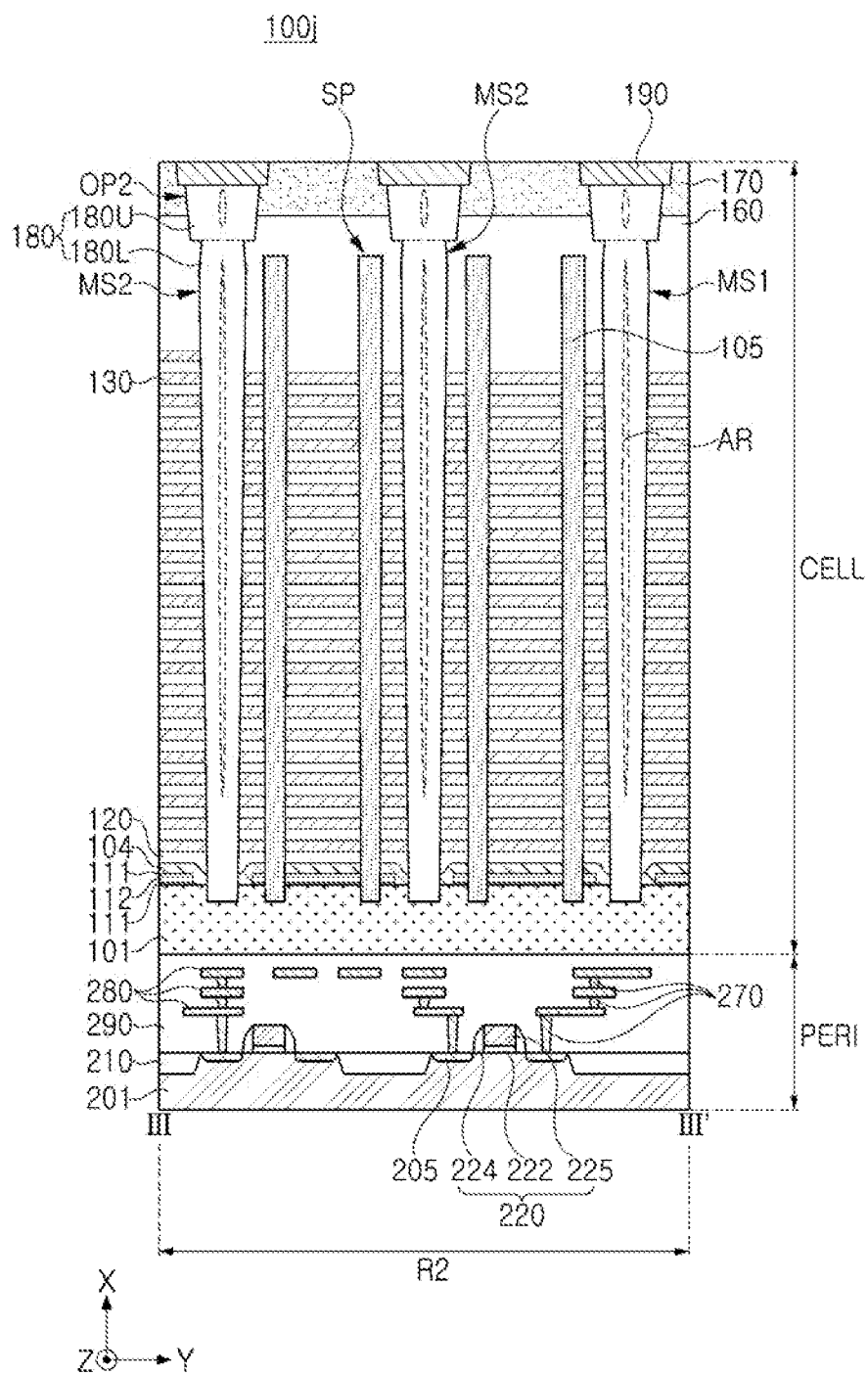
FIG. 9 is a cross-sectional view illustrating a semiconductor device according to an example embodiment.

FIG. 9 is a cross-sectional view illustrating a semiconductor device according to an example embodiment, illustrating a region corresponding to FIG. 2C.

Referring to FIG. 9, a semiconductor device 100j may include a memory cell region CELL and a peripheral circuit region PERI stacked vertically. The memory cell region CELL may be disposed on the peripheral circuit region PERI. For example, in the semiconductor device 100 in FIGS. 1A to 3, the peripheral circuit region PERI may be disposed on the substrate 101 in a region not illustrated, or as in the semiconductor device 100j in the example embodiment, the peripheral circuit region PERI may be disposed below the substrate 101. In example embodiments, the cell region CELL may be disposed below the peripheral circuit region PERI. The same description described with reference to FIGS. 1A to 3 may be applied to the description of the memory cell region CELL.

The peripheral circuit region PERI may include a base substrate 201, circuit devices 220 disposed on the base substrate 201, circuit contact plugs 270, and circuit interconnection lines 280.

The base substrate 201 may have an upper surface extending in the X-direction and the Y-direction. Device isolation layers 210 may be formed on the base substrate 201 and accordingly, an active region may be defined. Source/drain regions 205 including impurities may be disposed in a portion of the active region.

The base substrate 201 may include a semiconductor material, such as, for example, a group IV semiconductor, a group III-V compound semiconductor, or a group II-VI compound semiconductor. The base substrate 201 may be provided as a bulk wafer or an epitaxial layer. In an example embodiment, the upper substrate 101 may be provided as a polycrystalline semiconductor layer such as a polycrystalline silicon layer or an epitaxial layer.

The circuit devices 220 may include a planar transistor. The circuit devices 220 may be electrically connected to the gate electrodes 130 of the memory cell region CELL and the channel layers 140 of the channel structures CH. Each of the circuit devices 220 may include a circuit gate dielectric layer 222, a spacer layer 224, and a circuit gate electrode 225. The source/drain regions 205 may be disposed in the base substrate 201 on both side surfaces of the circuit gate electrode 225.

A peripheral region insulating layer 290 may be disposed on the circuit device 220 on the base substrate 201. The circuit contact plugs 270 may penetrate the peripheral region insulating layer 290, and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit interconnection lines 280 may be connected to the circuit contact plugs 270, and may be arranged in a plurality of layers.

In the semiconductor device 200, the peripheral circuit region PERI may first be manufactured, and the substrate 101 of the memory cell region CELL may be formed thereon, thereby manufacturing the memory cell region CELL. The substrate 101 may have a size smaller than that of the base substrate 201. The memory cell region CELL and the peripheral circuit region PERI may be connected to each other in a region not illustrated. For example, one end of the gate electrode 130 in the Y-direction may be electrically connected to the circuit devices 220.

The above-described form in which the memory cell region CELL and the peripheral circuit region PERI are vertically stacked may be applied to the other example embodiments.

Figure 10:
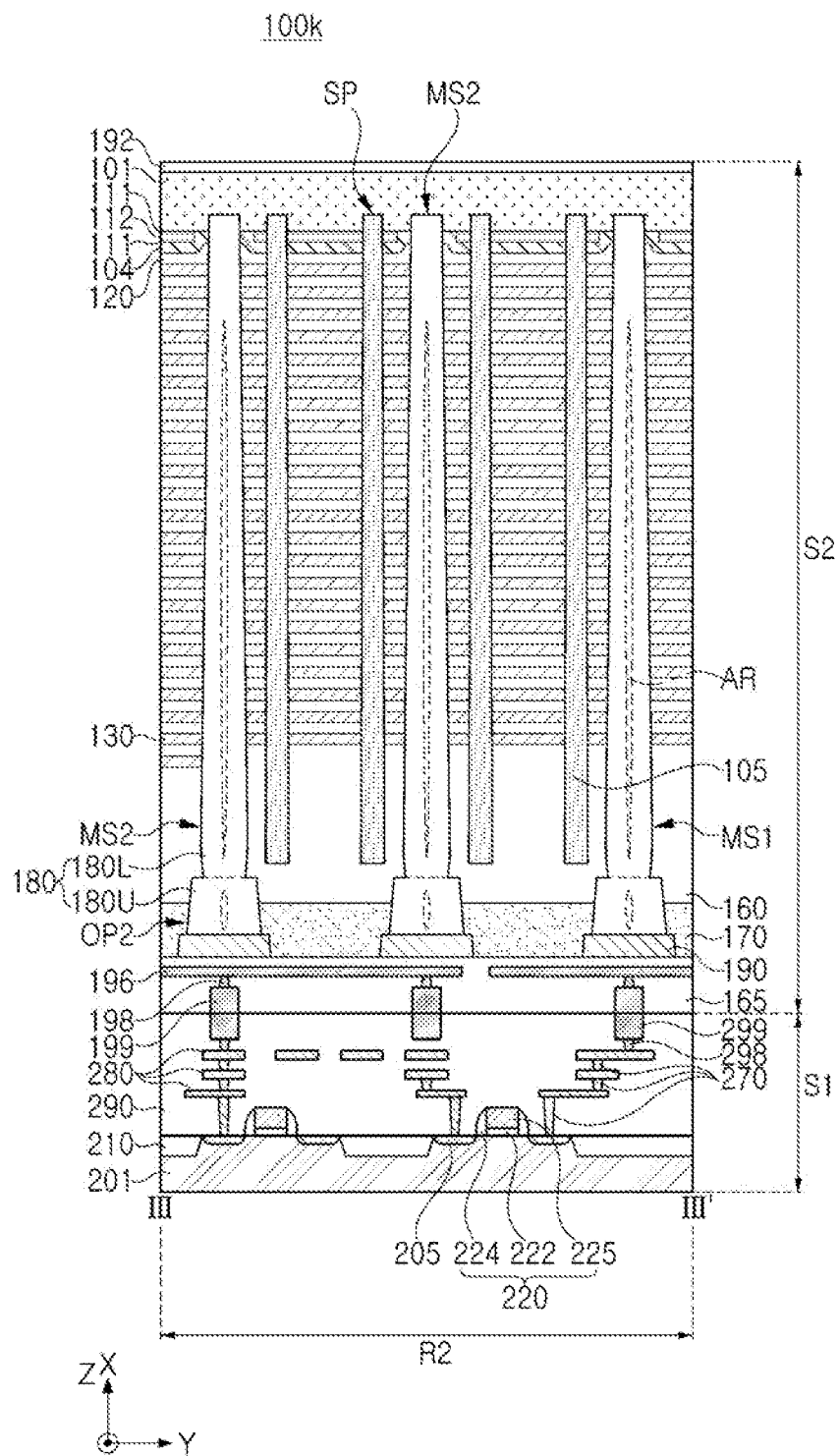
FIG. 10 is a cross-sectional view illustrating a semiconductor device according to an example embodiment.

FIG. 10 is a cross-sectional view illustrating a semiconductor device according to an example embodiment, illustrating a region corresponding to FIG. 2C.

Referring to FIG. 10, a semiconductor device 100k may include a first semiconductor structure S1 and a second semiconductor structure S2 bonded by a wafer bonding method.

The description of the peripheral circuit region PERI described in the aforementioned example embodiment with reference to FIG. 9 may be applied to the first semiconductor structure S1. However, the first semiconductor structure S1 may further include first bonding vias 298 and first bonding pads 299, which may be bonding structures. The first bonding vias 298 may be disposed on the uppermost circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 may provide an electrical connection path according to the bonding between the first semiconductor structure S1 and the second semiconductor structure S2 together with the second bonding pads 199.

The first bonding vias 298 and the first bonding pads 299 may include a conductive material, such as, for example, copper (Cu).

As for the second semiconductor structure S2, the descriptions described with reference to FIGS. 1A to 3 may be applied to the second semiconductor structure S2 unless otherwise indicated. The second semiconductor structure S2 may further include cell interconnection lines 196 and an upper cell region insulating layer 165, which may be interconnection structures, and may further include second bonding vias 198 which may be bonding structures, and the second bonding pads 199. The second semiconductor structure S2 may further include a protective layer 192 covering the upper surface of the substrate 101.

The cell interconnection lines 196 may be disposed below the gate electrodes 130 and may connect the second bonding vias 198 to each other. The cell interconnection lines 196 may be connected to bit lines of the semiconductor device 100k and cell contact plugs connected to the bit lines in a region not illustrated. However, in example embodiments, the number of the cell contact plugs and the number of the cell interconnection lines included in the interconnection structure and the arrangement form thereof may be varied.

The cell interconnection lines 196 may be formed of a conductive material, and may include, for example, at least one of tungsten (W), aluminum (Al), and copper (Cu).

The second bonding vias 198 and the second bonding pads 199 may be disposed below lowermost cell interconnection lines 196. The second bonding vias 198 may be connected to the cell interconnection lines 196 and the second bonding pads 199, and the second bonding pads 199 may be connected to the first bonding pads 299 of the first semiconductor structure S1. The second bonding vias 198 and the second bonding pads 199 may include a conductive material, such as, for example, copper (Cu).

The first semiconductor structure S1 and the second semiconductor structure S2 may be bonded to each other by copper (Cu)-to-copper (Cu) bonding by the first bonding pads 299 and the second bonding pads 199. In addition to the copper (Cu)-to-copper (Cu) bonding, the first semiconductor structure S1 and the second semiconductor structure S2 may be additionally bonded to each other by dielectric-to-dielectric bonding. The dielectric-to-dielectric bonding may be bonding by dielectric layers forming a portion of each of the peripheral region insulating layer 290 and the upper cell region insulating layer 165 and surrounding each of the first bonding pads 299 and the second bonding pads 199. Accordingly, the first semiconductor structure S1 and the second semiconductor structure S2 may be bonded to each other without an adhesive layer.

FIGS. 11A to 20B are cross-sectional views illustrating a method of manufacturing a semiconductor device according to an example embodiment, illustrating regions corresponding to FIG. 2A or FIG. 2C.

Figure 11A:
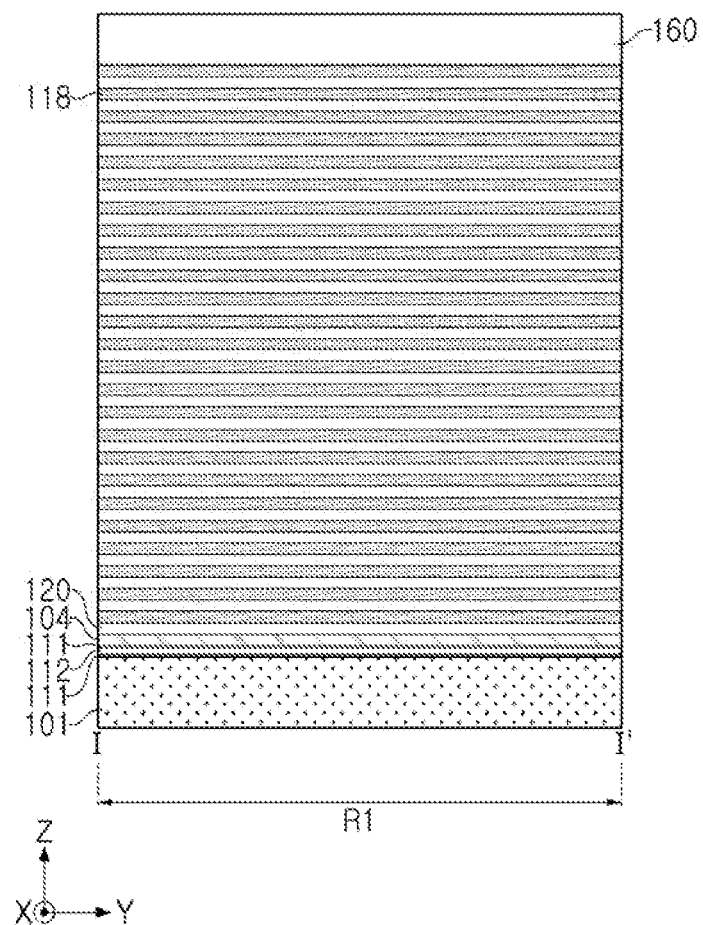
FIGS. 11A to 20B are cross-sectional views illustrating a method of manufacturing a semiconductor device according to an example embodiment.
Figure 11B:
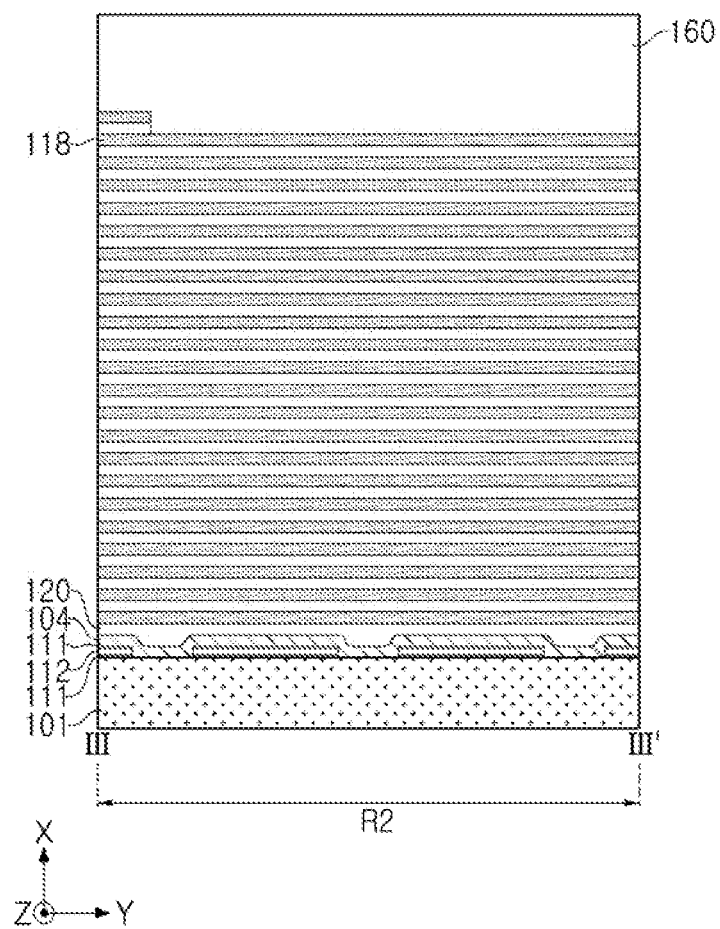

Referring to FIGS. 11A and 11B, first and second horizontal sacrificial layers 111 and 112 and a second horizontal conductive layer 104 may be formed on the substrate 101 having the first region R1 and the second region R2, and sacrificial insulating layers 118 and interlayer insulating layers 120 may be alternately stacked thereon.

The first and second horizontal sacrificial layers 111 and 112 may be stacked on the substrate 101 such that the first horizontal sacrificial layers 111 may be disposed above and below the second horizontal sacrificial layer 112. The first and second horizontal sacrificial layers 111 and 112 may include different materials. The first and second horizontal sacrificial layers 111 and 112 may be replaced with the first horizontal conductive layer 102 (see FIG. 2A) in the first region R1 through a subsequent process. For example, the first horizontal sacrificial layer 111 may be formed of the same material as that of the interlayer insulating layers 120, and the second horizontal sacrificial layer 112 may be formed of the same material as that of the sacrificial insulating layers 118. The first and second horizontal sacrificial layers 111 and 112 may be removed from at least a portion of the second region R2.

The second horizontal conductive layer 104 may be formed on the first and second horizontal sacrificial layers 111 and 112. In the region from which the first and second horizontal sacrificial layers 111 and 112 are removed, the second horizontal conductive layer 104 may be in contact with the substrate 101.

The sacrificial insulating layers 118 may be partially replaced with the gate electrodes 130 (see FIGS. 2A and 2C) through a subsequent process. The sacrificial insulating layers 118 may be formed of a material different from that of the interlayer insulating layers 120, and may be formed of a material etched with etching selectivity with respect to the interlayer insulating layers 120 under predetermined etching conditions. For example, the interlayer insulating layer 120 may be formed of at least one of silicon oxide and silicon nitride, and the sacrificial insulating layers 118 may be formed of a material different from that of the interlayer insulating layer 120, selected from among silicon, silicon oxide, silicon carbide, and silicon nitride.

In example embodiments, thicknesses of the interlayer insulating layers 120 may not be the same. The thicknesses of the interlayer insulating layers 120 and the sacrificial insulating layers 118 and the number of films included in the interlayer insulating layers 120 and the sacrificial insulating layers 118 may be varied from the illustrated example.

A photolithography process and an etching process may be repeatedly performed on the sacrificial insulating layers 118 using a mask layer such that the upper sacrificial insulating layers 118 may extend shorter than the lower sacrificial insulating layers 118 in the second region R2. Accordingly, the sacrificial insulating layers 118 may form a stepped structure in a staircase shape by a predetermined unit.

Thereafter, the cell region insulating layer 160 covering the stack structure of the sacrificial insulating layers 118 and the interlayer insulating layers 120 may be formed.

Figure 12A:
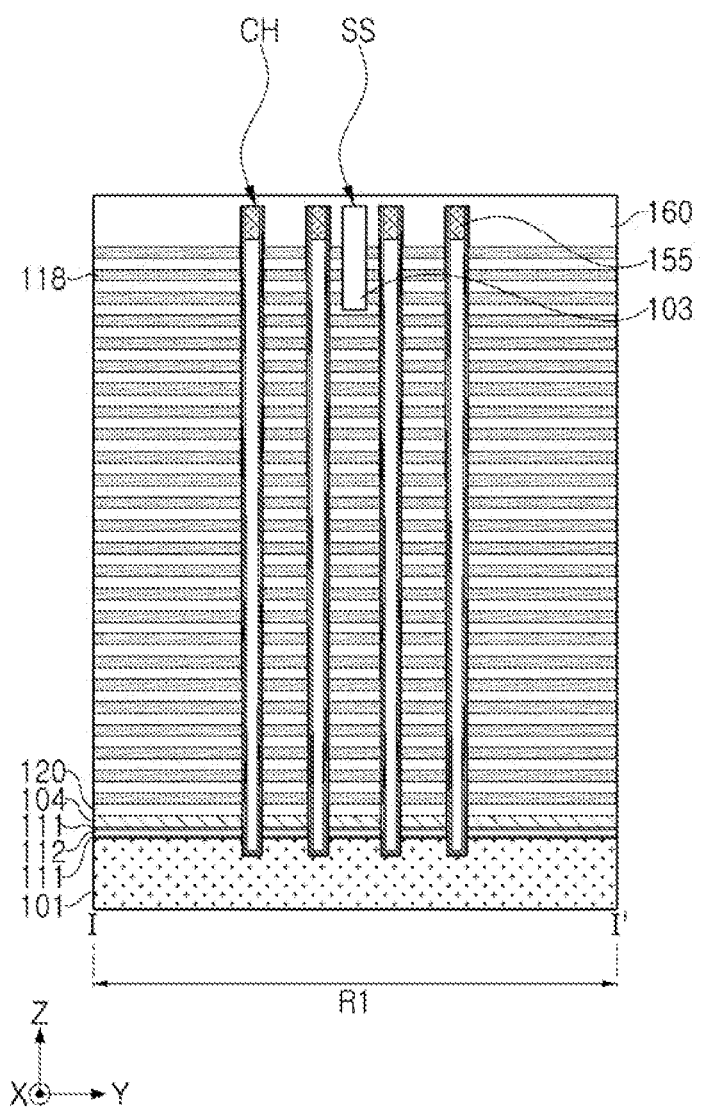
Figure 12B:
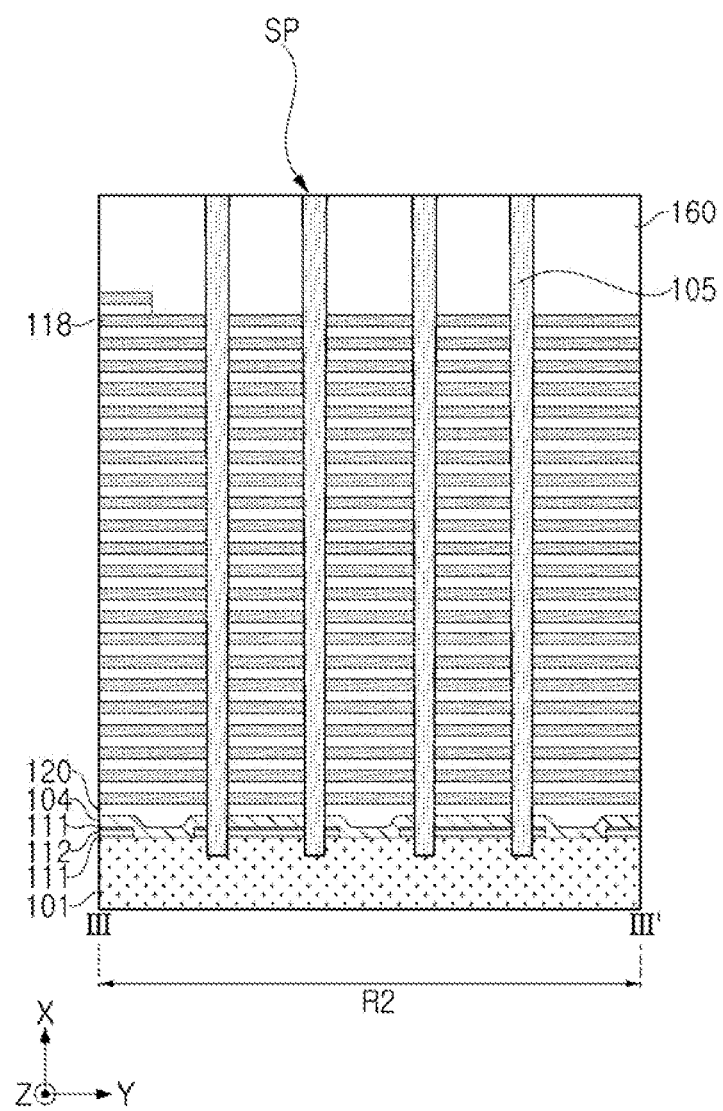

Referring to FIGS. 12A and 12B, channel structures CH and support structures SP penetrating the stack structure of the sacrificial insulating layers 118 and the interlayer insulating layers 120 may be formed.

For example, first, upper separation regions SS may be formed by removing a portion of the sacrificial insulating layers 118 and the interlayer insulating layers 120 in the first region R1. The region in which the upper separation regions SS may be formed may be exposed using a separate mask layer, a predetermined number of the sacrificial insulating layers 118 and the interlayer insulating layers 120 may be removed from an uppermost portion, an insulating material may be deposited, thereby forming the upper separation insulating layer 103.

The channel structures CH may be formed by anisotropically etching the sacrificial insulating layers 118 and the interlayer insulating layers 120 using a mask layer in the first region R1, and may be formed by forming hole-shaped channels and filling the channels. Due to a height of the stack structure, sidewalls of the channel structures CH may not be perpendicular to an upper surface of the substrate 101. The channel structures CH may be partially recessed into the substrate 101.

Thereafter, at least a portion of the gate dielectric layer 145, the channel layer 140, the channel filling insulating layer 150, and the channel pad 155 may be formed in order in the channel structures CH. The gate dielectric layer 145 may be formed to have a uniform thickness using an ALD or CVD process. In this process, the entire gate dielectric layer 145 or a portion of the gate dielectric layer 145 may be formed, and a portion extending perpendicularly to the substrate 101 along the channel structures CH may be formed in this process. The channel layer 140 may be formed on the gate dielectric layer 145 in the channel structures CH. The channel filling insulating layer 150 may fill the channel structures CH, and may be an insulating material. The channel pad 155 may be formed of a conductive material, such as, for example, polycrystalline silicon.

Thereafter, the cell region insulating layer 160 may be further formed to cover upper ends of the channel structures CH, and support structures SP may be formed in the second region R2. Similarly to the channel structures CH, the support structures SP may be formed by forming support holes in the second region R2 and filling the holes. The support structures SP may be formed by filling the support holes with an insulating material and forming the support insulating layer 105. In example embodiments, the channel holes and the support holes may be formed together.

Figure 13A:
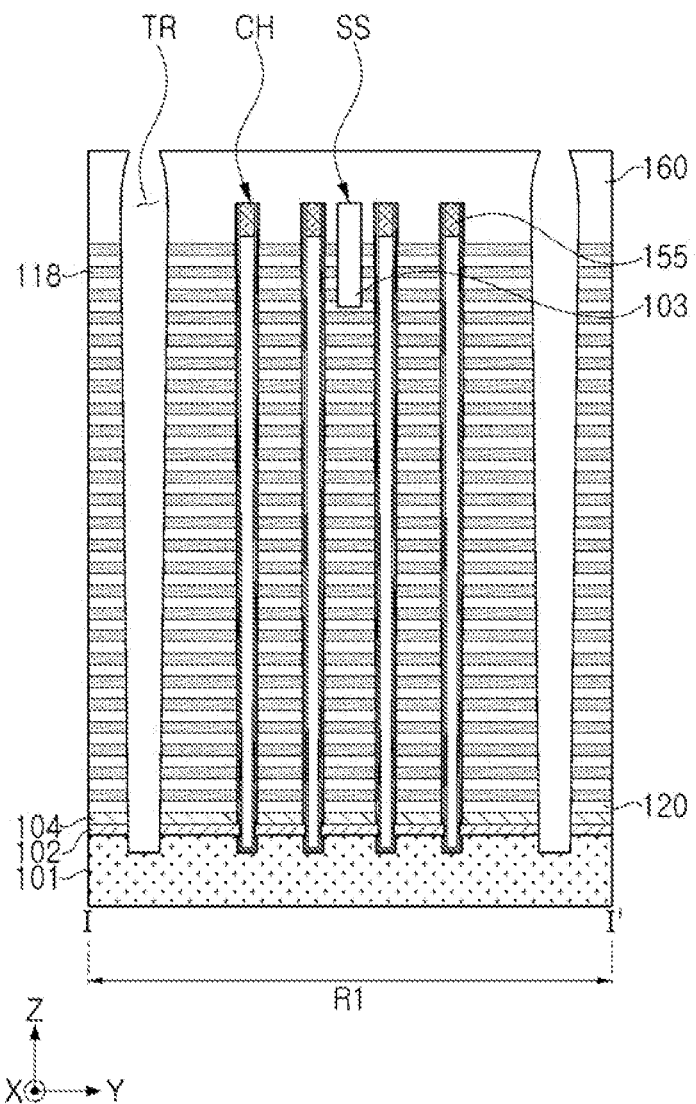
Figure 13B:
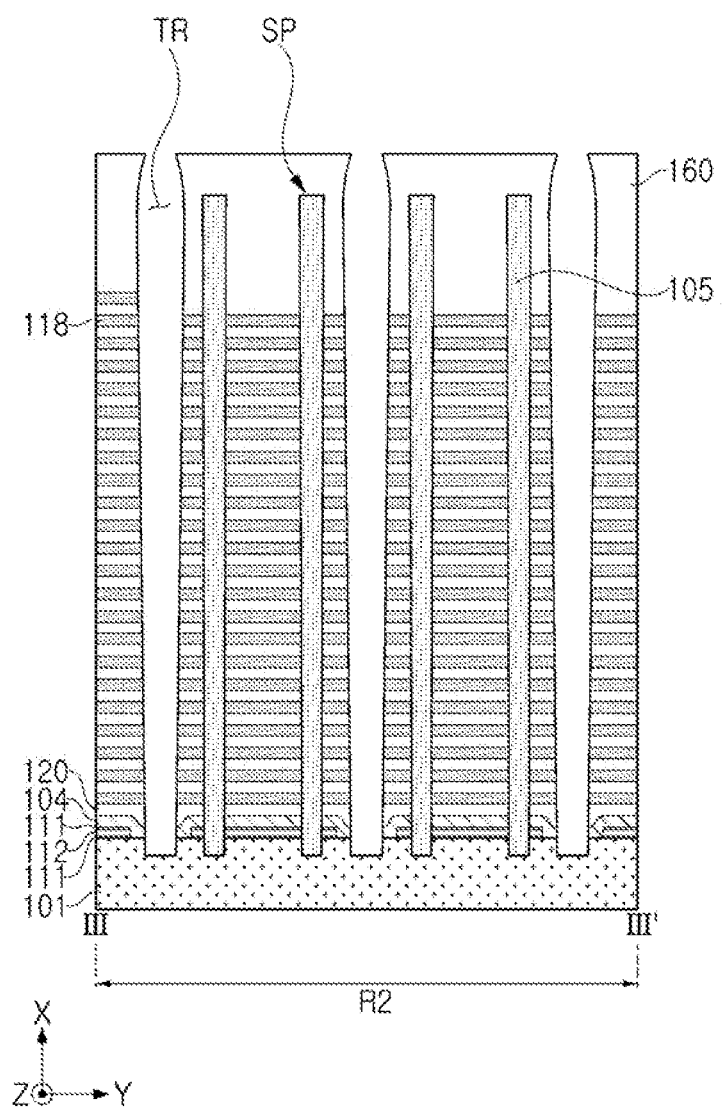

Referring to FIGS. 13A and 13B, in regions corresponding to the first and second separation regions MS1 and MS2 (see FIG. 1A), trenches TR penetrating the sacrificial insulating layers 118 and the interlayer insulating layers 120, and the first horizontal conductive layer 102 may be formed.

For example, first, the cell region insulating layer 160 may be additionally formed on the support structures SP, and the trenches TR may be formed. The trenches TR may penetrate the stack structure of the sacrificial insulating layers 118 and the interlayer insulating layers 120, and may penetrate the second horizontal conductive layer 104 therebelow. Thereafter, the second horizontal sacrificial layer 112 may be exposed in the first region R1 by an etch-back process while forming sacrificial spacer layers in the trenches TR. The exposed second horizontal sacrificial layer 112 may be selectively removed, and the upper and lower first horizontal sacrificial layers 111 may be removed.

The first and second horizontal sacrificial layers 111 and 112 may be removed by, for example, a wet etching process. In the process of removing the first and second horizontal sacrificial layers 111 and 112, a portion of the gate dielectric layer 145 exposed in the region from which the second horizontal sacrificial layer 112 is removed may also be removed. The first horizontal conductive layer 102 may be formed in the first region R1 by depositing a conductive material in the region from which the first and second horizontal sacrificial layers 111 and 112 are removed, and the sacrificial spacer layers may be removed from the trenches TR.

Figure 14A:
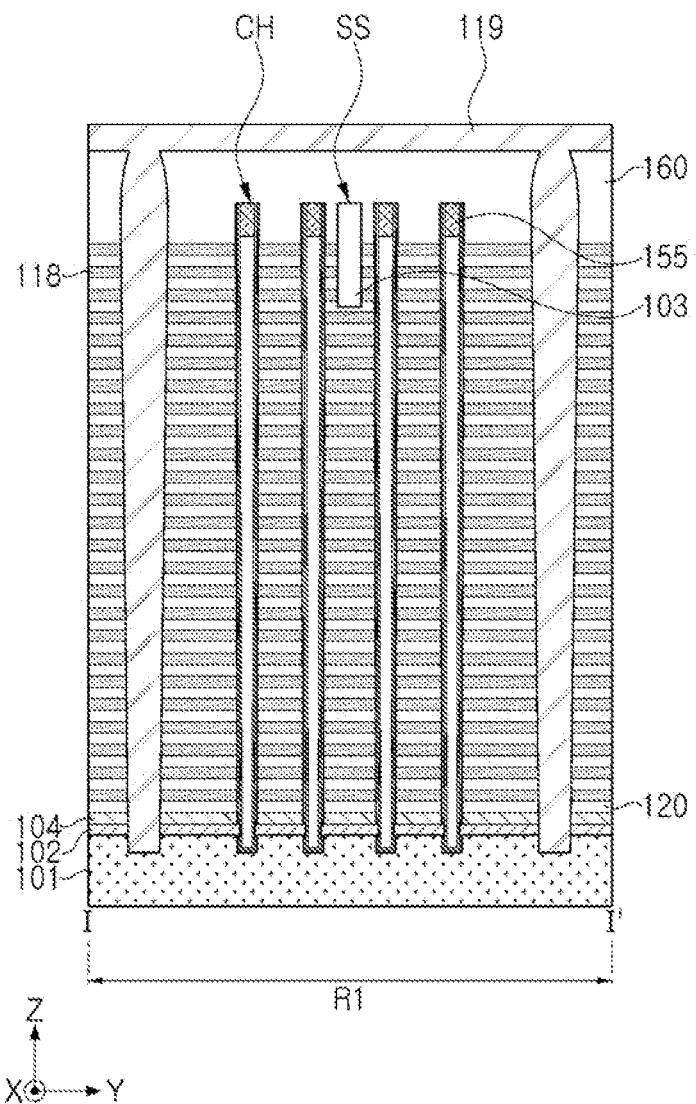
Figure 14B:
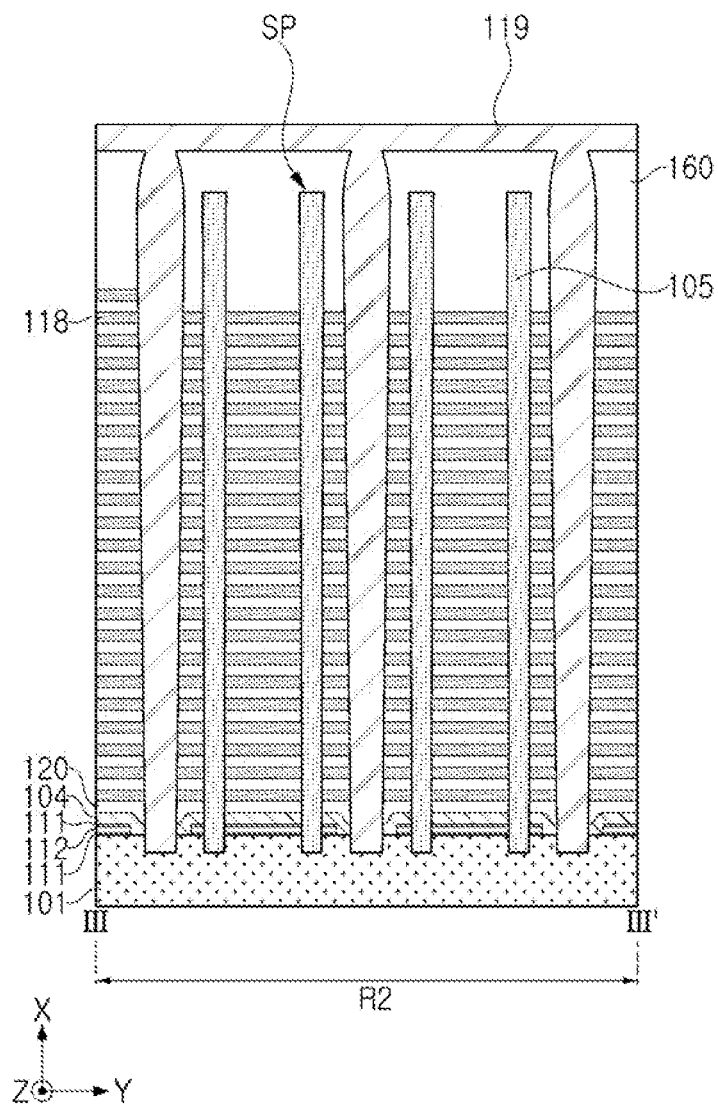

Referring to FIGS. 14A and 14B, a vertical sacrificial layer 119 filling the trenches OP may be formed. The vertical sacrificial layer 119 may fill the trenches OP.

The vertical sacrificial layer 119 may be formed of a single layer or a plurality of layers. For example, the vertical sacrificial layer 119 may include a double layer of silicon nitride/polycrystalline silicon.

Figure 15A:
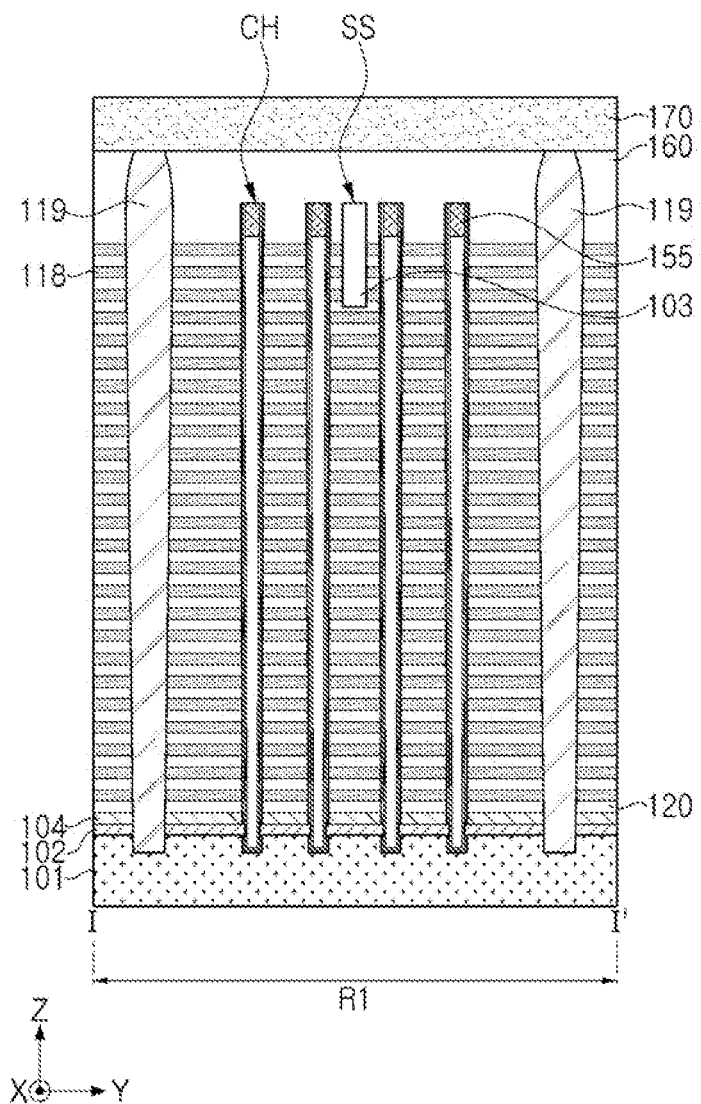
Figure 15B:
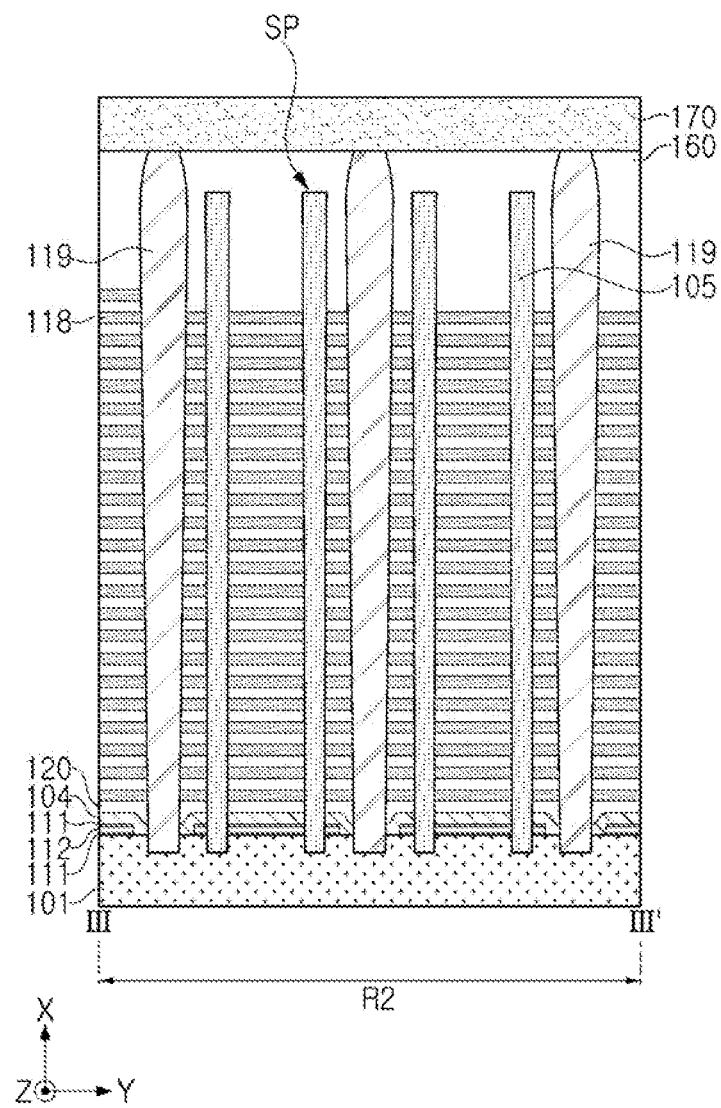

Referring to FIGS. 15A and 15B, an upper support layer 170 may be formed on the cell region insulating layer 160.

For example, first, the vertical sacrificial layer 119 may be removed from the cell region insulating layer 160 through a planarization process, such that the vertical sacrificial layer 119 may be disposed only in the trenches TR. Thereafter, an upper support layer 170 may be formed on the vertical sacrificial layers 119 and the cell region insulating layer 160. The upper support layer 170 may be provided to support the stack structure of the interlayer insulating layers 120 during the process of removing the sacrificial insulating layers 118, performed subsequently.

Figure 16A:
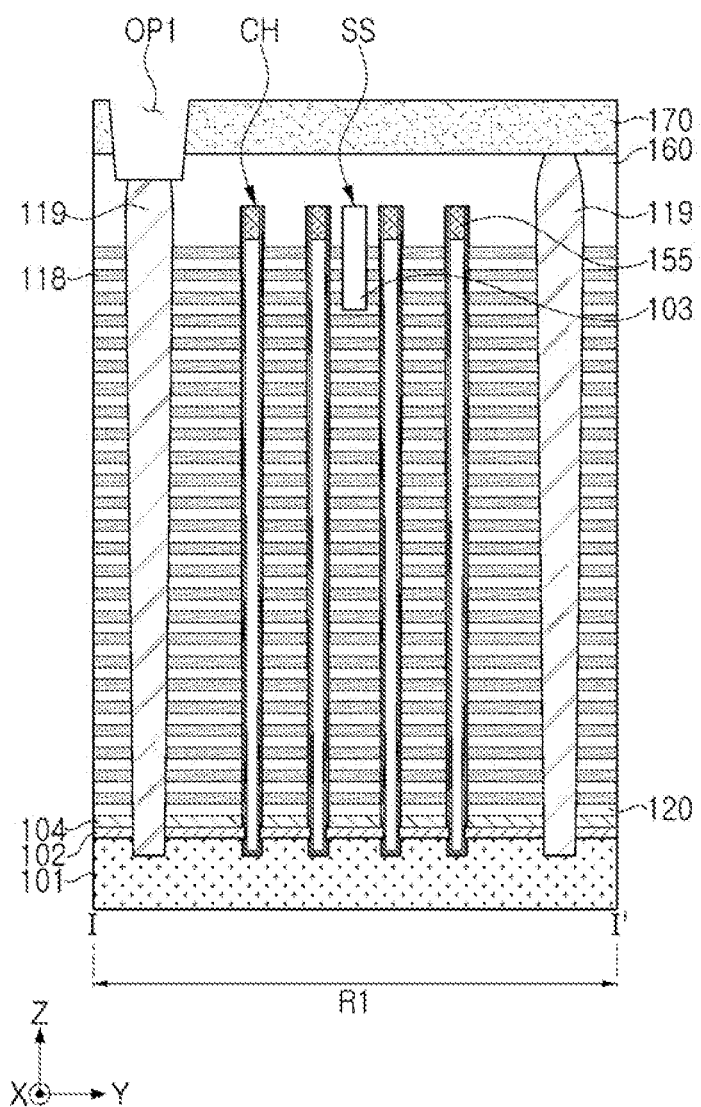
Figure 16B:
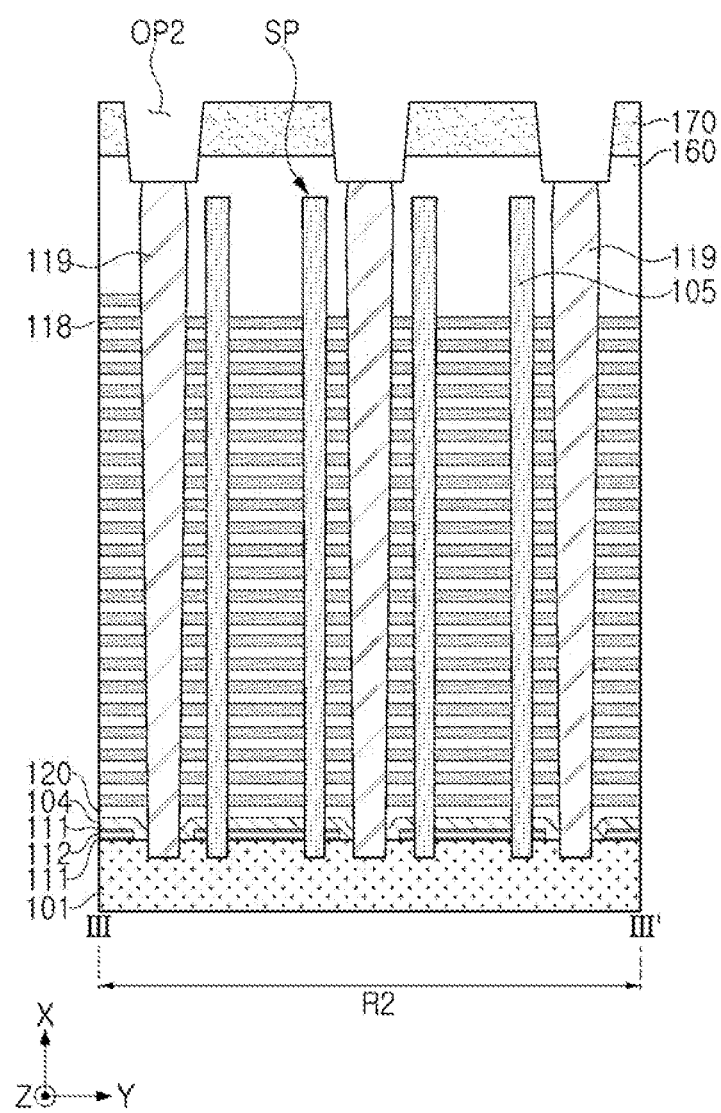

Referring to FIGS. 16A and 16B, the first and second openings OP1 and OP2 may be formed by removing a portion of the upper support layer 170.

The first and second openings OP1 and OP2 may be formed along the vertical sacrificial layers 119 extending linearly in the X-direction to expose the vertical sacrificial layers 119 in partial regions, as illustrated in FIG. 1B. In the first region R1, the first openings OP1 may be spaced apart from each other on the vertical sacrificial layers 119 in the X-direction. In the second region R2, the second openings OP2 may extend in the X-direction along the vertical sacrificial layers 119. However, in example embodiments, the shapes of the first and second openings OP1 and OP2 are not limited thereto.

The first and second openings OP1 and OP2 may be formed deeper than the lower surface of the upper support layer 170, and may be formed by removing a portion of the cell region insulating layer 160 and a portion of the vertical sacrificial layers 119. However, in example embodiments, the first and second openings OP1 and OP2 may be formed to have substantially the same depth as that of the lower surface of the upper support layer 170.

Figure 17A:
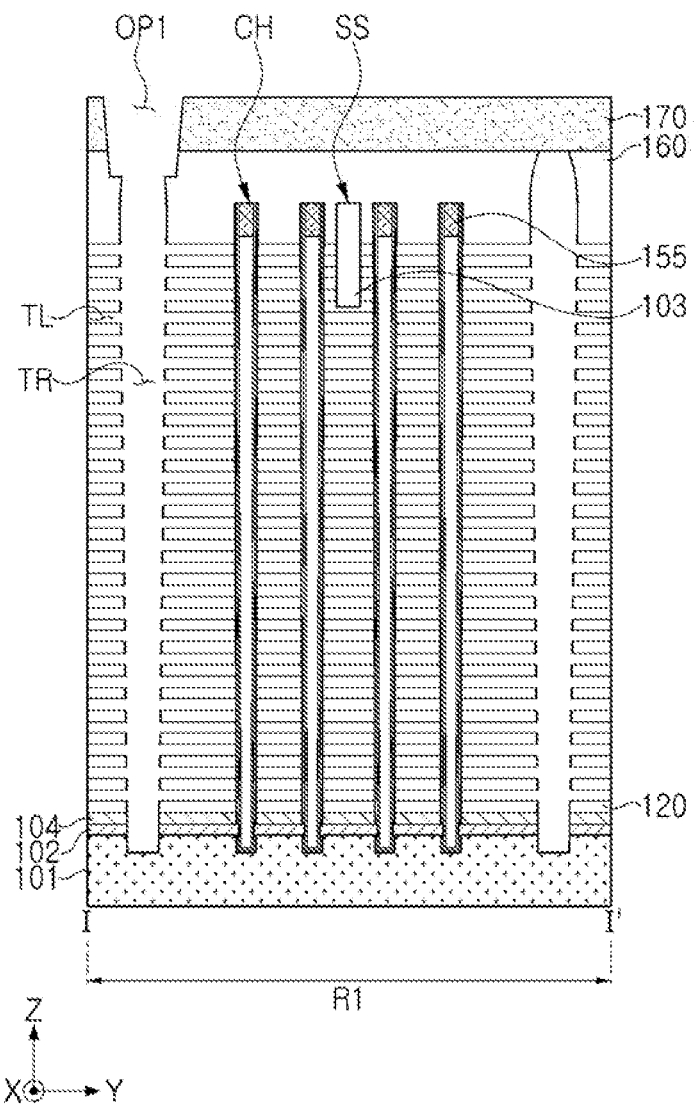
Figure 17B:
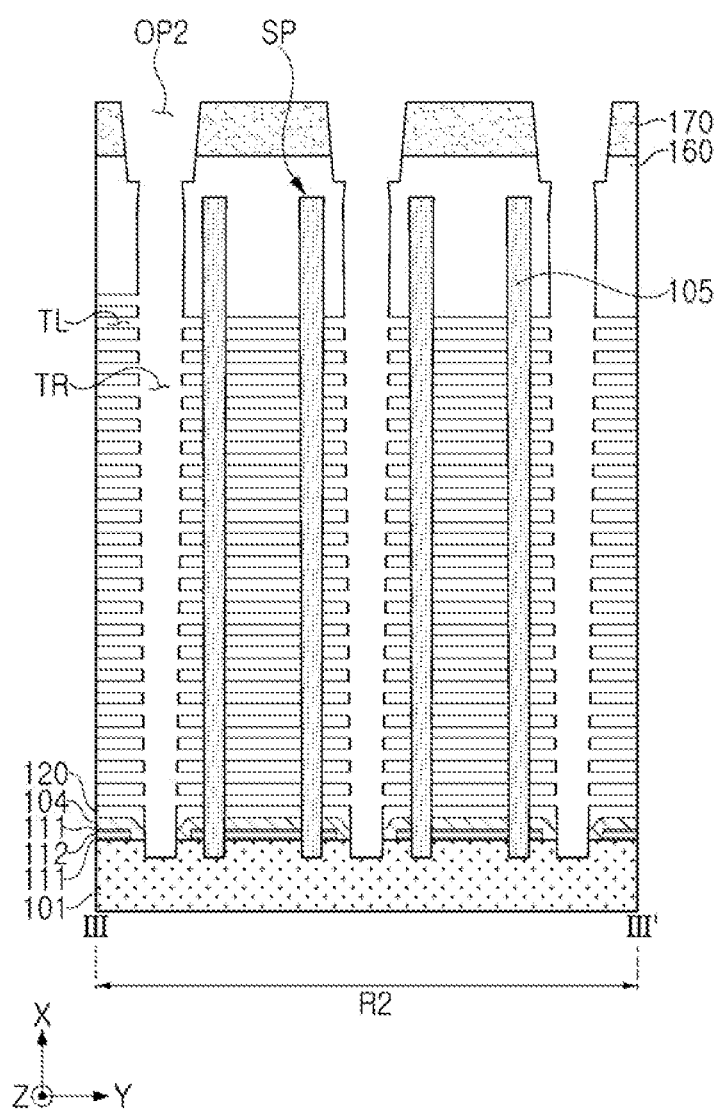

Referring to FIGS. 17A and 17B, the trenches TR may be formed again by removing the vertical sacrificial layers 119 through the first and second openings OP1 and OP2, and tunnel portions TL may be formed by removing the sacrificial insulating layers 118 through the trenches TR.

For example, first, the vertical sacrificial layers 119 may be selectively removed through the first and second openings OP1 and OP2. Thereafter, the sacrificial insulating layers 118 may be selectively removed through the trenches TR. The vertical sacrificial layers 119 and the sacrificial insulating layers 118 may be selectively removed with respect to the interlayer insulating layers 120 using, for example, wet etching. Accordingly, a plurality of tunnel portions TL may be formed between the interlayer insulating layers 120.

Figure 18A:
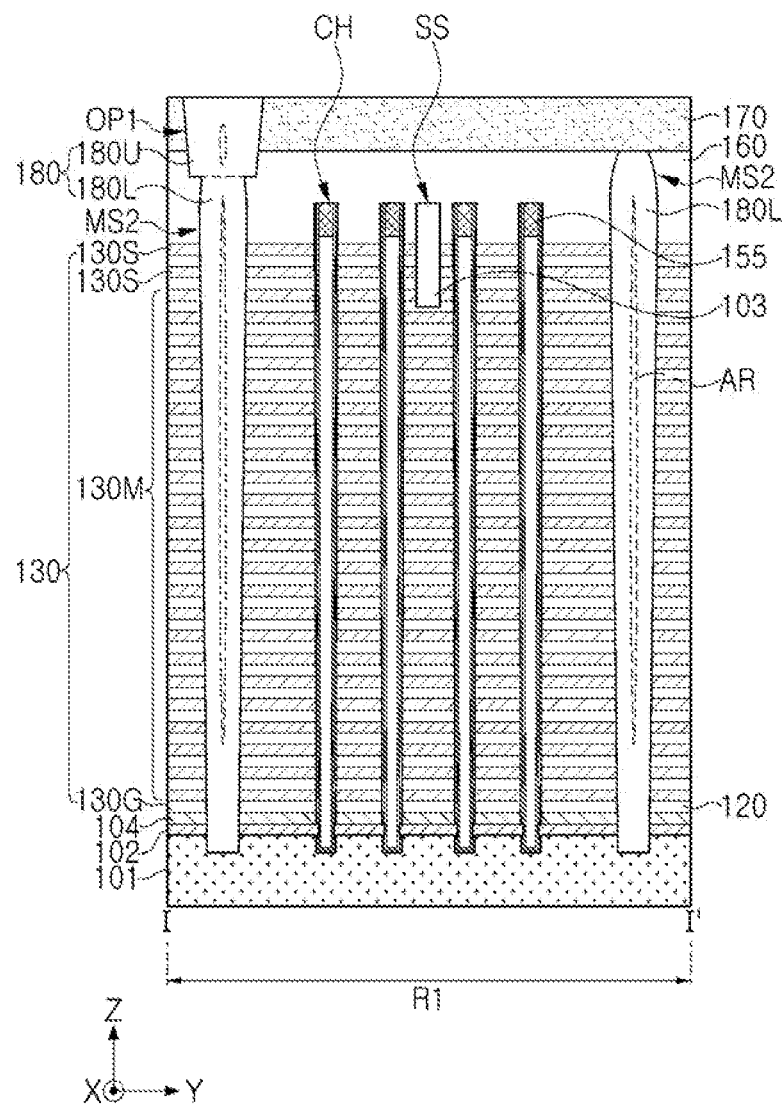
Figure 18B:
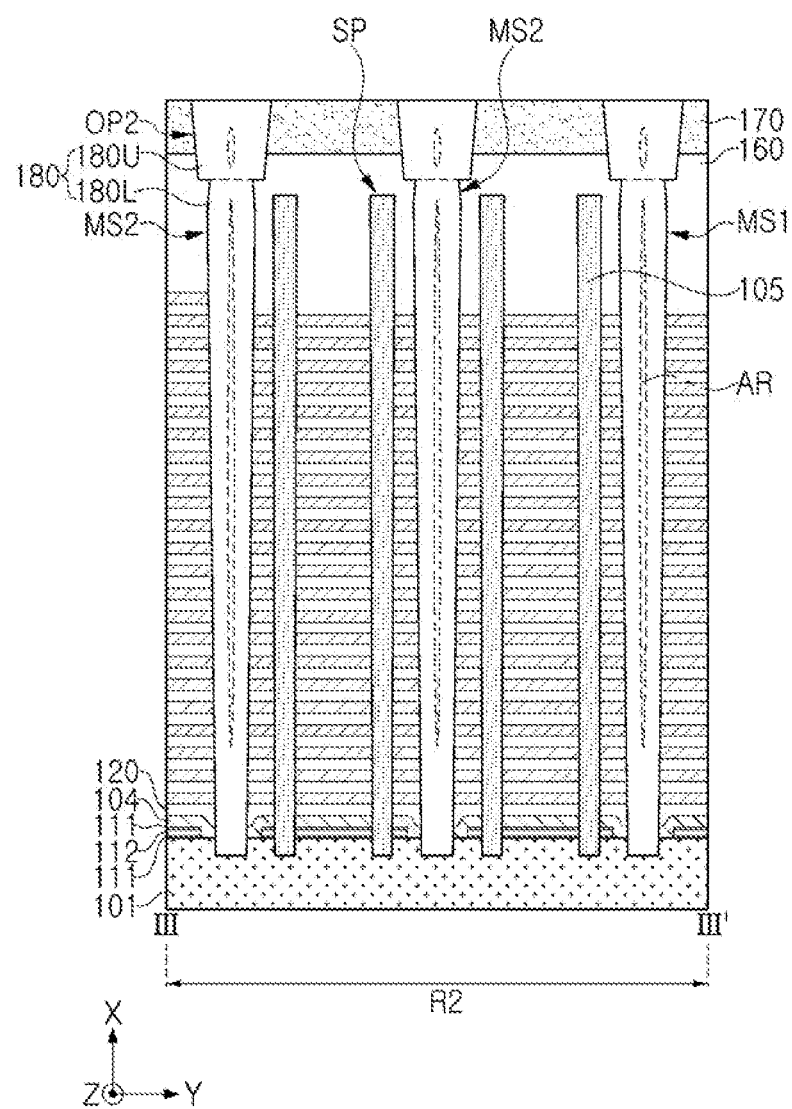

Referring to FIGS. 18A and 18B, the gate electrodes 130 may be formed by filling the tunnel portions TL (from which the sacrificial insulating layers 118 are removed) with a conductive material, and the separation insulating layers 180 may be formed.

The conductive material forming the gate electrodes 130 may fill the tunnel portions TL. The conductive material may include a metal, polycrystalline silicon, or a metal silicide material. The gate electrodes 130 may be formed, the conductive material deposited in the trenches TR may be removed through an additional process, and the separation insulating layers 180 may be formed. When the conductive material is removed, the gate electrodes 130 may be partially removed from the trenches TR. In this case, the separation insulating layers 180 may include partial regions horizontally extending from the trenches TR to side surfaces of the gate electrodes 130.

The separation insulating layers 180 may be formed by depositing an insulating material to fill the trenches TR, and performing a planarization process such as a chemical mechanical polishing (CMP) process.

The separation insulating layer 180 may include a lower region 180L and an upper region 180U. The upper region 180U may form a bent portion between the upper region 180U and the lower region 180L, and may extend into the first and second openings OP1 and OP2 of the upper support layer 170.

Accordingly, the first and second separation regions MS1 and MS2 may be formed.

In example embodiments, the first and second separation regions MS1 and MS2 may further include a conductive layer disposed in the separation insulating layers 180 in addition to the separation insulating layers 180. In this case, the conductive layer may function as a source contact connected to a common source line of the semiconductor device.

Figure 19A:
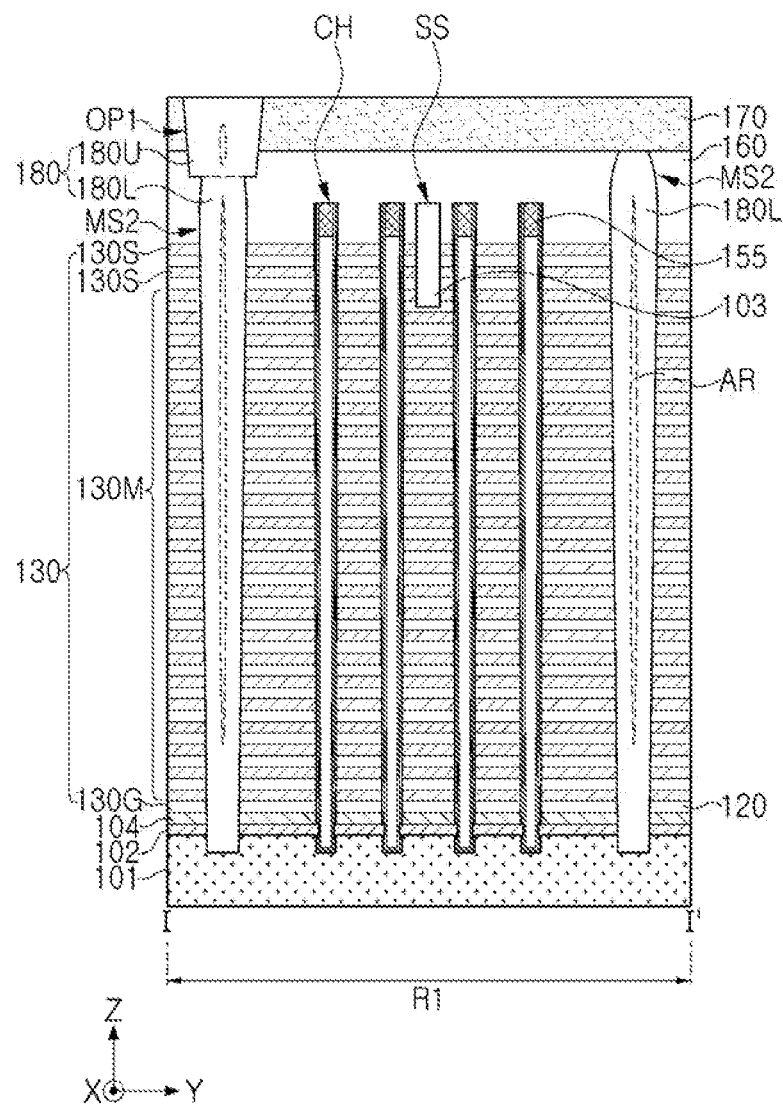
Figure 19B:
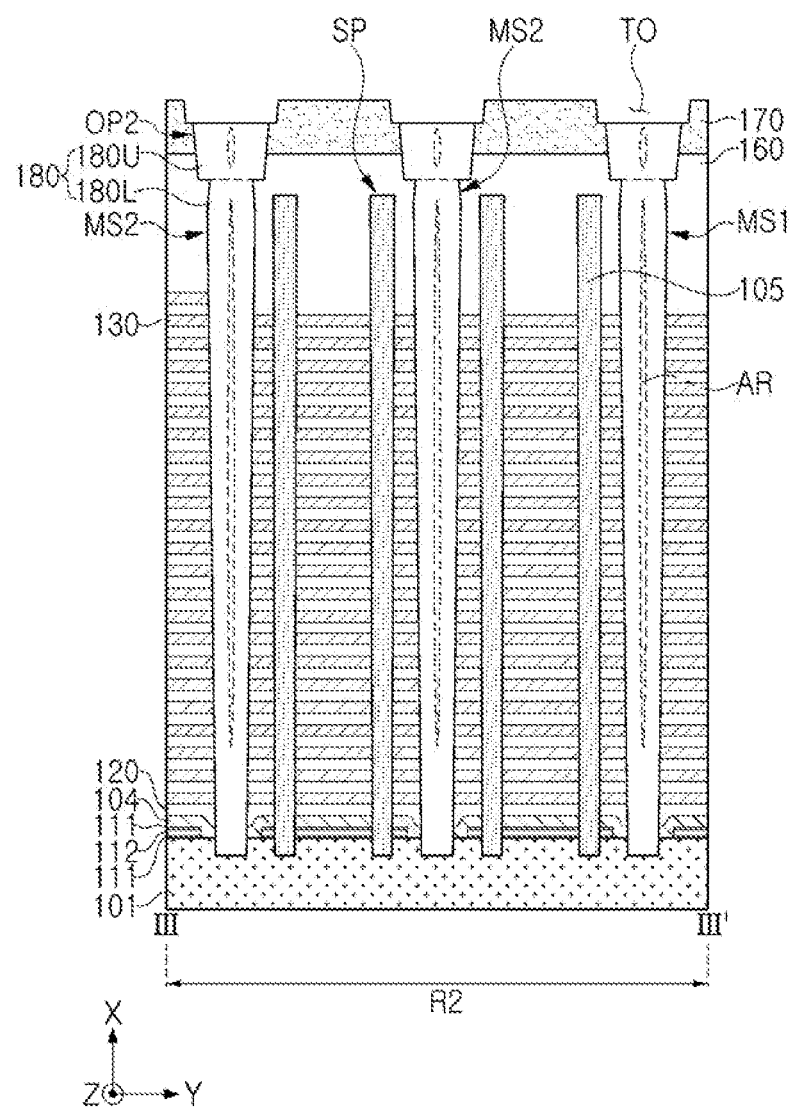

Referring to FIGS. 19A and 19B, upper openings TO exposing upper regions 180U of the separation insulating layers 180 may be formed.

The upper openings TO may be formed to be recessed into the upper regions 180U in the second region R2. However, as in the example embodiments in FIGS. 5B to 5D, the upper openings TO may also be formed in the first region R1 in some example embodiments. Also, as in the example embodiments in FIGS. 4A and 4B and the example embodiments in FIGS. 6A to 7B, the depth and the width of the upper openings TO may be varied in the example embodiments.

Bottom surfaces of the upper openings TO may be disposed on a level higher than a level of an upper end of a seam AG of the separation insulating layers 180. For example, the upper openings TO may be formed to not open the seam AG.

Figure 20A:
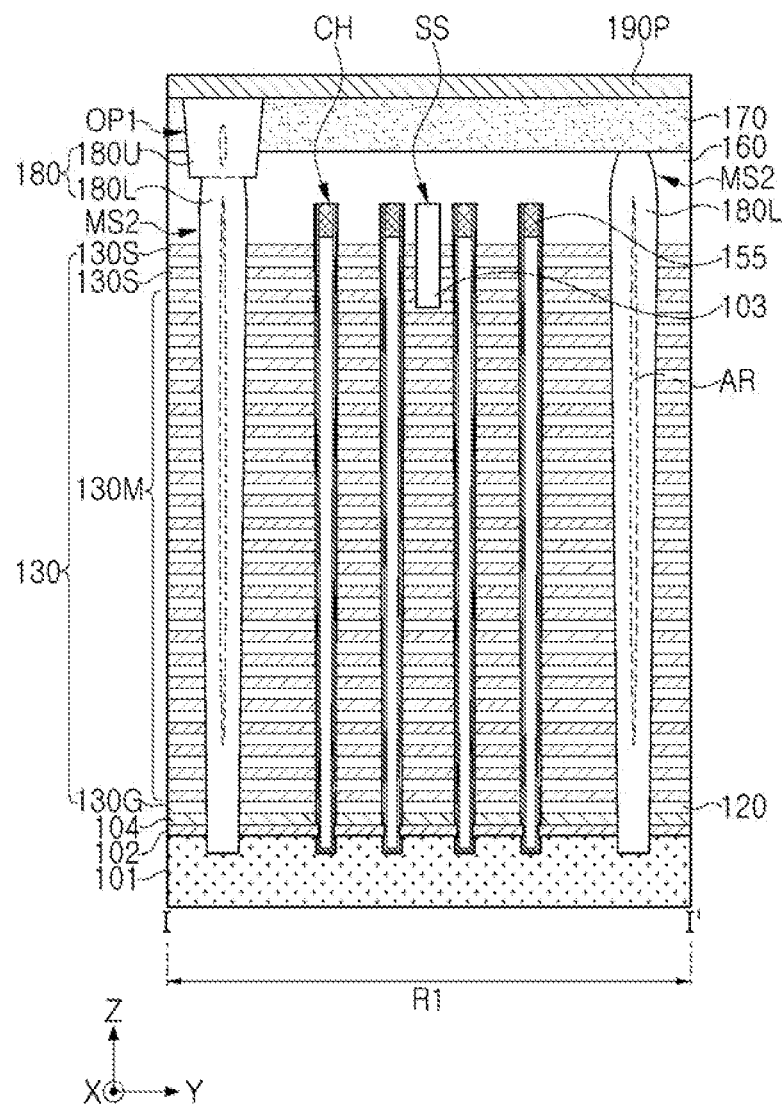
Figure 20B:
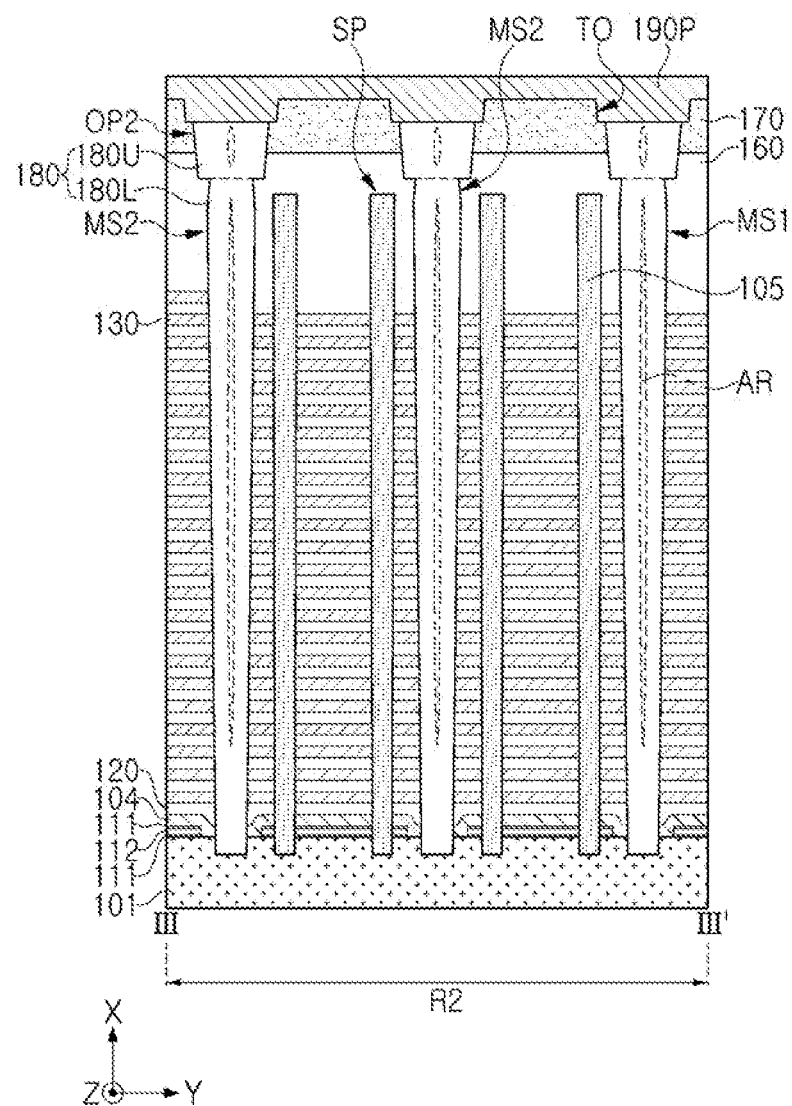

Referring to FIGS. 20A and 20B, a preliminary crack prevention layer 190P may be formed in the upper openings TO. The preliminary crack prevention layer 190P may be formed to fill the upper openings TO.

The preliminary crack prevention layer 190P may include, for example, silicon such as polycrystalline silicon, but an example embodiment thereof is not limited thereto.

Thereafter, referring back to FIGS. 2A and 2C, a crack prevention layer 190 disposed only in the upper openings TO may be formed by performing a planarization process on the preliminary crack prevention layer 190P.

Thereafter, a capping insulating layer may be formed on an upper portion, and an upper interconnection structure including the gate contacts 195 may be formed, thereby manufacturing the semiconductor device 100.

Figure 21:
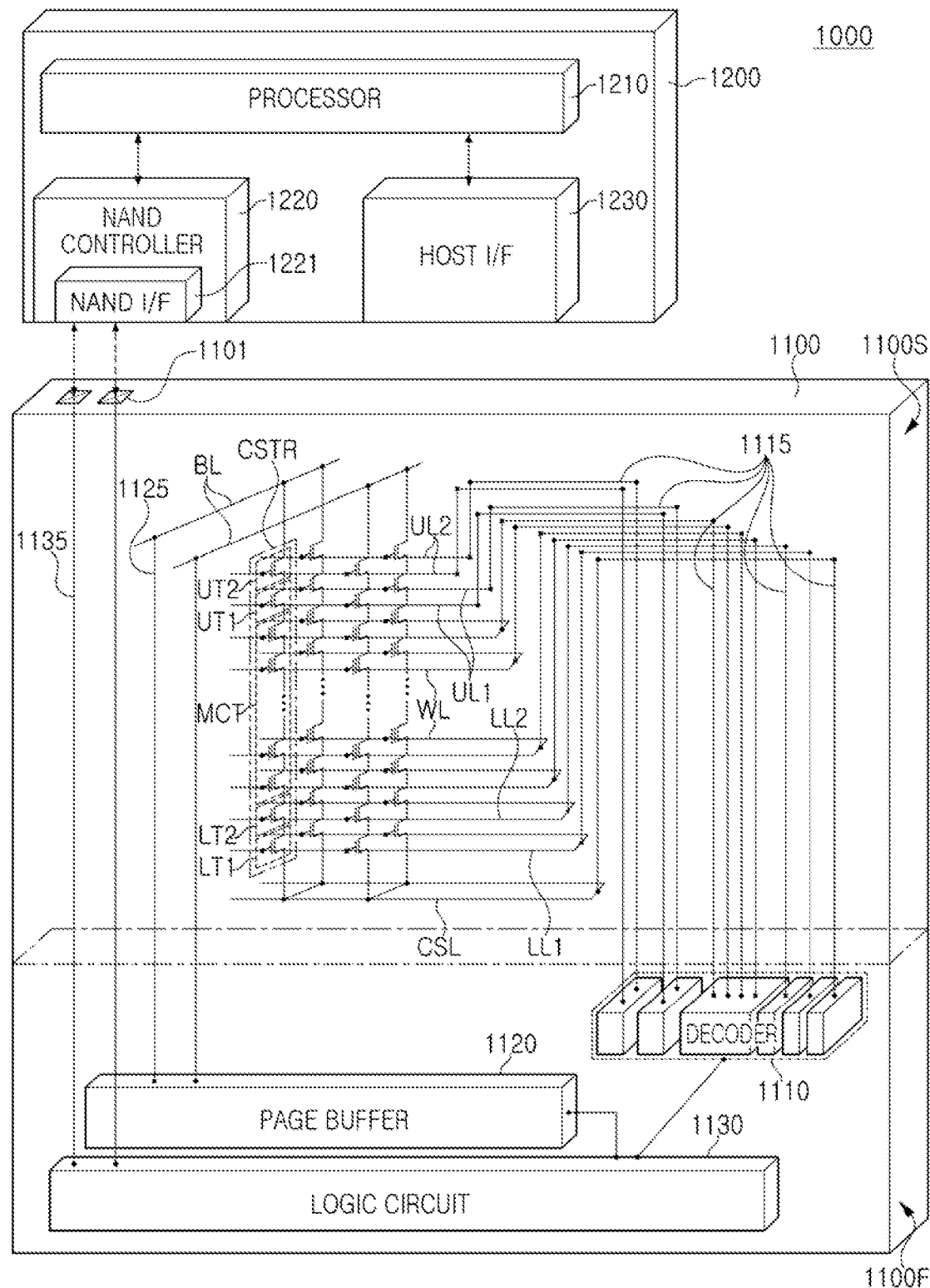
FIG. 21 is a view illustrating a data storage system including a semiconductor device according to an example embodiment.

FIG. 21 is a view illustrating a data storage system including a semiconductor device according to an example embodiment.

Referring to FIG. 21, a data storage system 1000 may include a semiconductor device 1100 and a controller 1200 electrically connected to the semiconductor device 1100.

The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1A to 10, for example.

The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130.

The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230.

In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220.

The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221.

The host interface 1230 may provide a communication function between the data storage system 1000 and an external host. When a control command is received from an external host through the host interface 1230, the processor 1210 may control the semiconductor device 1100 in response to the control command.

Figure 22:
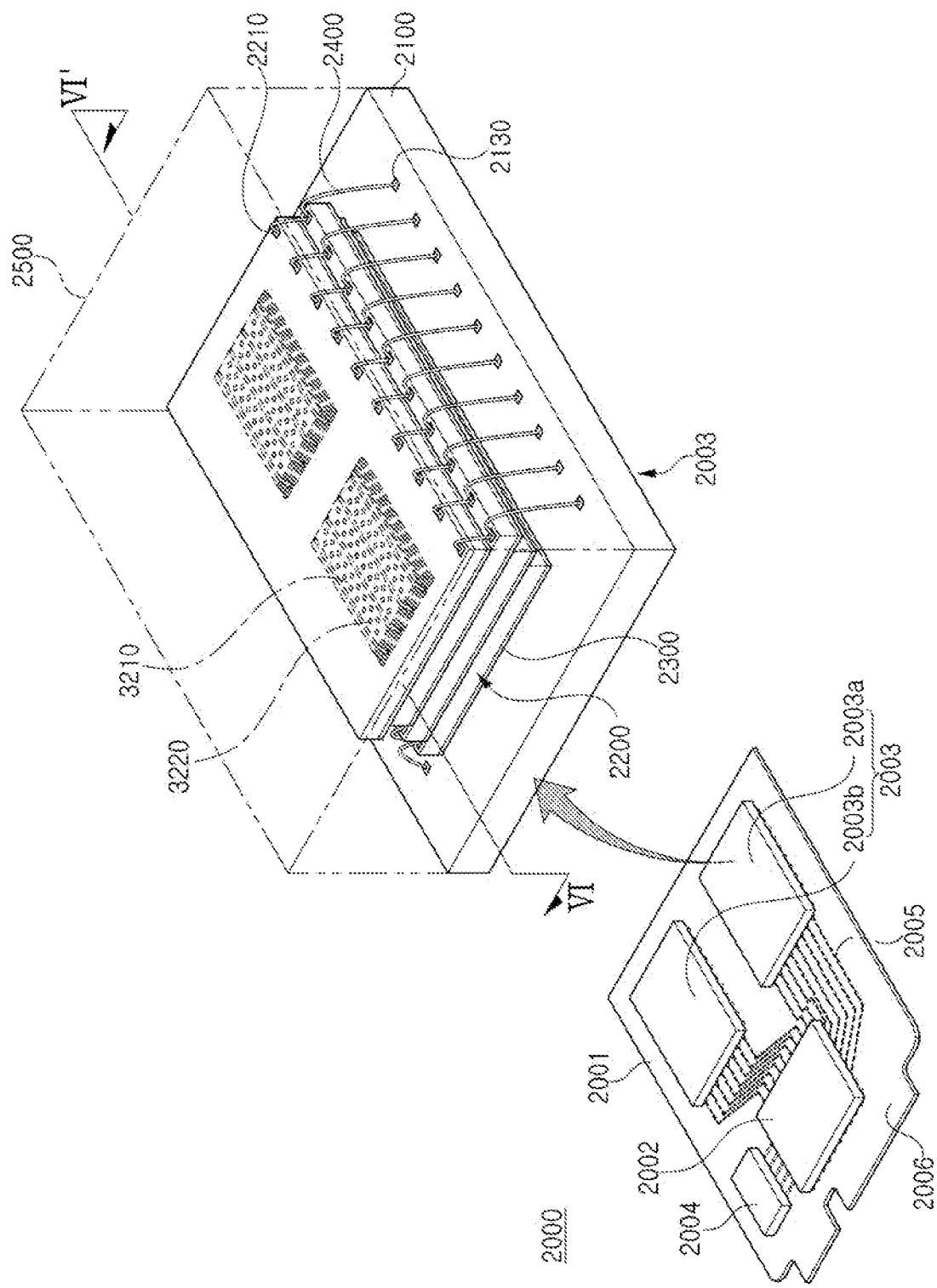
FIG. 22 is a perspective view illustrating a data storage system including a semiconductor device according to an example embodiment.

FIG. 22 is a perspective view illustrating a data storage system including a semiconductor device according to an example embodiment.

Referring to FIG. 22, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host.

In example embodiments, the data storage system 2000 may communication with the external host through one of a universal serial bus (USB), a peripheral component interconnect express (PCI-Express), a serial advanced technology attachment (SATA), and an M-phy for universal flash storage (UFS).

In example embodiments, the data storage system 2000 may operate by power supplied from the external host through the connector 2006.

The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130.

Each of the semiconductor chips 2200 may include an input and output pad 2210. The input and output pad 2210 may correspond to the input and output pad 1101 in FIG. 21. Each of the semiconductor chips 2200 may include gate stack structures 3210 and channel structures 3220. Each of the semiconductor chips 2200 may include the semiconductor device described with reference to FIGS. 1A to 10.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 23:
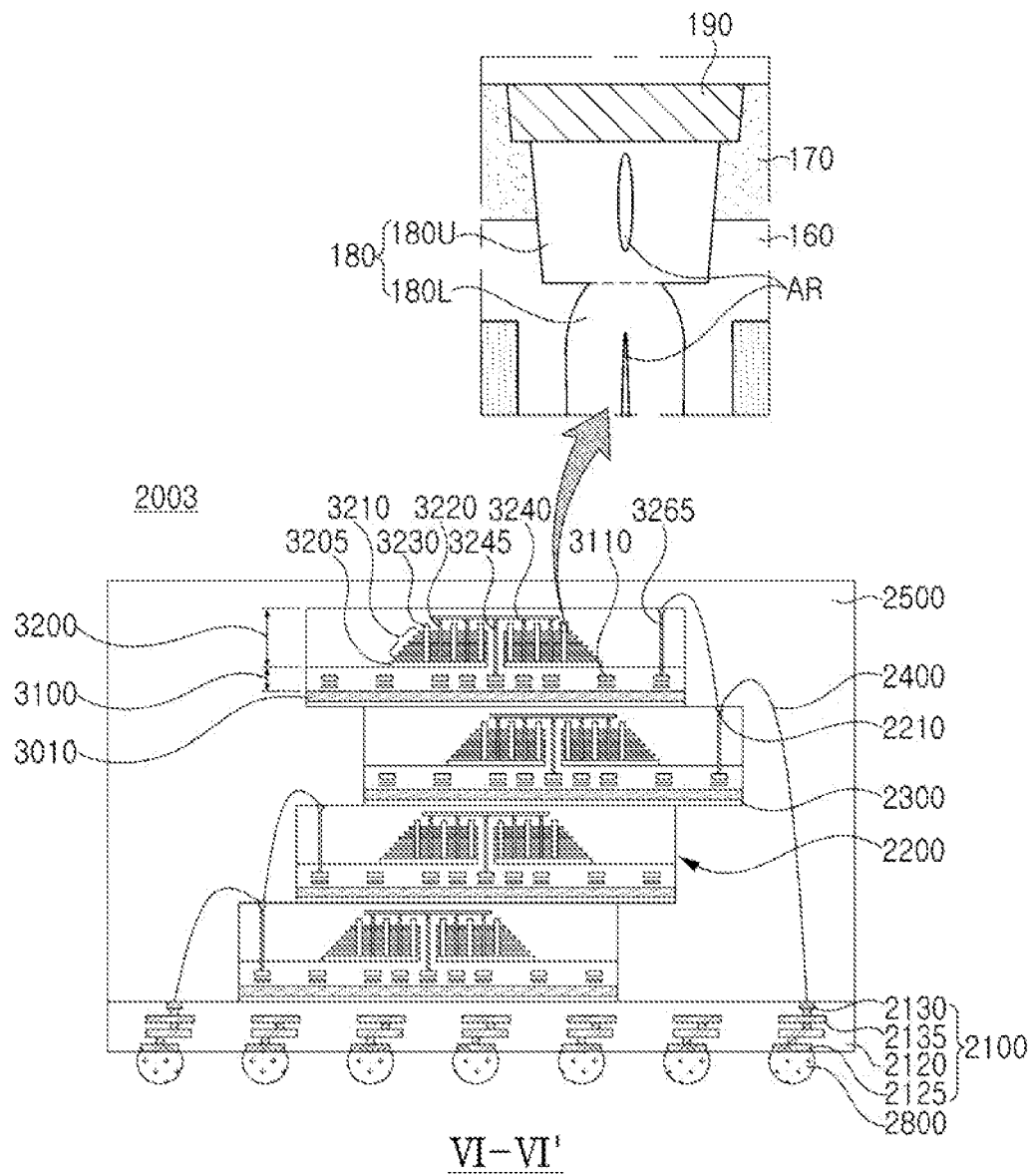
FIG. 23 is a cross-sectional view illustrating a semiconductor package according to an example embodiment.

FIG. 23 is a cross-sectional view illustrating a semiconductor device according to an example embodiment. FIG. 23 illustrates an example embodiment of the semiconductor package 2003 in FIG. 22, and illustrates the semiconductor package 2003 in FIG. 22 taken along line VI-VI'.

Referring to FIG. 23, in the semiconductor package 2003, the package substrate 2100 may be configured as a printed circuit board. The package substrate 2100 may include a package substrate body portion 2120, package upper pads 2130 (see FIG. 22) disposed on an upper surface of the package substrate body portion 2120, lower pads 2125 disposed on a lower surface of the package substrate body portion 2120 or exposed through the lower surface, and internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 22.

Each of the semiconductor chips 2200 may include a semiconductor substrate 3010, and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation structures 3230 penetrating the gate stack structure 3210, bit lines 3240 electrically connected to the memory channel structures 3220, and cell contact plugs 3235 electrically connected to the word lines WL (see FIG. 21) of the gate stack structure 3210.

As described with reference to FIGS. 1A to 10, in each of the semiconductor chips 2200, the crack prevention layer 190 may be disposed on a portion of the separation insulating layer 180.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed on an external side of the gate stack structure 3210, and may be further disposed to penetrate the gate stack structure 3210. Each of the semiconductor chips 2200 may further include an input and output pad 2210 (see FIG. 22) electrically connected to the peripheral interconnections 3110 of the first semiconductor structure 3100.

According to the aforementioned example embodiments, by disposing the crack prevention layer including a material having a larger Young's modulus than that of the material of the separation region on the separation region, a semiconductor device having improved reliability and a data storage system including the same may be provided.

An example embodiment may provide a semiconductor device having improved reliability. An example embodiment may provide a data storage system including a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first region and a second region;
gate electrodes stacked on the substrate and spaced apart from each other in a first direction perpendicular to an upper surface of the substrate, and extending by different lengths in a second direction perpendicular to the first direction on the second region;
channel structures penetrating the gate electrodes, extending in the first direction, and each including a channel layer;
a horizontal conductive layer disposed below the gate electrodes on the substrate, and in contact with the channel layer of each of the channel structures;
separation regions penetrating the gate electrodes, extending in the first direction and the second direction, and spaced apart from each other in a third direction perpendicular to the first direction and the second direction;
a cell region insulating layer covering the gate electrodes and the channel structures;
an upper support layer disposed on the cell region insulating layer and having openings disposed to overlap the separation regions in the first direction; and
crack prevention layers in contact with upper surfaces of the separation regions, and having side surfaces, in the third direction, covered by the upper support layer, wherein:
each of the separation regions has a first width in the third direction,
each of the crack prevention layers has a second width greater than the first width in the third direction, and
lower surfaces of the crack prevention layers are disposed on a level higher than a level of upper surfaces of the channel structures.

2. The semiconductor device as claimed in claim 1, wherein the side surfaces of the crack prevention layers in the third direction and side surfaces of the separation regions in the third direction are spaced apart from each other.

3. The semiconductor device as claimed in claim 1, wherein each of the separation regions includes a lower region, and upper regions extending from the lower region into the openings of the upper support layer.

4. The semiconductor device as claimed in claim 3, wherein:
the lower region has a third width in the third direction,
each of the upper regions has a fourth width greater than the third width in the third direction, and
the fourth width is smaller than the second width.

5. The semiconductor device as claimed in claim 3, wherein the crack prevention layers are connected to at least a portion of the upper regions.

6. The semiconductor device as claimed in claim 3, wherein the crack prevention layers are connected to the lower region.

7. The semiconductor device as claimed in claim 3, wherein a thickness of each of the crack prevention layers is in a range of about 1500 Å to about 5000 Å.

8. The semiconductor device as claimed in claim 1, wherein:
the separation regions include a material having a first Young's modulus, and
the crack prevention layers include a material having a second Young's modulus greater than the first Young's modulus.

9. The semiconductor device as claimed in claim 8, wherein the upper support layer includes a material having a third Young's modulus smaller than the second Young's modulus.

10. The semiconductor device as claimed in claim 8, wherein the crack prevention layers include at least one of silicon (Si), silicon nitride (SiN), and tungsten (W).

11. The semiconductor device as claimed in claim 1, wherein a difference between coefficients of thermal expansion of the crack prevention layers and the substrate is smaller than a difference between coefficients of thermal expansion of the upper support layer and the substrate.

12. The semiconductor device as claimed in claim 1, wherein the crack prevention layers are spaced apart from each other in the second direction on the separation regions.

13. The semiconductor device as claimed in claim 1, wherein the crack prevention layers extend in the second direction along the separation regions.

14. The semiconductor device as claimed in claim 1, wherein the crack prevention layers are disposed only in the second region.

15. The semiconductor device as claimed in claim 1, further comprising support structures penetrating the gate electrodes, and extending in the first direction in the second region,
wherein the lower surfaces of the crack prevention layers are disposed on a level lower than a level of a lower surface of the upper support layer, and higher than a level of upper surfaces of the support structures.

16. The semiconductor device as claimed in claim 1, wherein each of the separation regions include a seam therein, and the lower surfaces of the crack prevention layers are disposed on a level higher than a level of the seam.

17. The semiconductor device as claimed in claim 1, further comprising circuit devices disposed below the substrate and electrically connected to the gate electrodes and the channel structures.

18. A semiconductor device, comprising:
a substrate;
gate electrodes stacked and spaced apart from each other in a first direction perpendicular to an upper surface of the substrate;
channel structures penetrating the gate electrodes, extending in the first direction, and each including a channel layer;
separation regions penetrating the gate electrodes, extending in the first direction and a second direction perpendicular to the first direction, and spaced apart from each other in a third direction perpendicular to the first direction and the second direction; and
crack prevention layers disposed on at least a portion of the separation regions, wherein:
each of the separation regions includes a lower region, and upper regions spaced apart from each other in the second direction on the lower region and protruding upwardly from the lower region, and
the crack prevention layers are in contact with upper surfaces of the upper regions.

19. The semiconductor device as claimed in claim 18, wherein:
each of the upper regions has a first width in the third direction, and
each of the crack prevention layers has a second width greater than the first width in the third direction.

20. A data storage system, comprising:
a semiconductor storage device including a substrate, circuit devices disposed on one side of the substrate, and input/output pads electrically connected to the circuit devices; and
a controller electrically connected to the semiconductor storage device through the input/output pad and configured to control the semiconductor storage device,
wherein the semiconductor storage device includes:
gate electrodes stacked and spaced apart from each other in a first direction perpendicular to an upper surface of the substrate;
channel structures penetrating the gate electrodes, extending in the first direction, and each including a channel layer;
separation regions penetrating the gate electrodes, extending in the first direction and a second direction perpendicular to the first direction, and spaced apart from each other in a third direction perpendicular to the first direction and the second direction; and
crack prevention layers disposed on at least a portion of the separation regions, wherein:
each of the separation regions includes a lower region, and upper regions spaced apart from each other in the second direction on the lower region and protruding upwardly from the lower region, and
the crack prevention layers are in contact with upper surfaces of the upper regions.

* * * * *